(12) United States Patent
Ogino

(10) Patent No.: US 8,158,312 B2
(45) Date of Patent: Apr. 17, 2012

(54) EXPOSURE METHOD USING CHARGED PARTICLE BEAM

(75) Inventor: Kozo Ogino, Yokohama (JP)

(73) Assignee: Fujitsu Semiconductor Limited, Yokohama (JP)

( * ) Notice: Subject to any disclaimer, the term of this patent is extended or adjusted under 35 U.S.C. 154(b) by 82 days.

(21) Appl. No.: 12/846,243

(22) Filed: Jul. 29, 2010

(65) Prior Publication Data

US 2011/0033789 A1 Feb. 10, 2011

(30) Foreign Application Priority Data

Aug. 4, 2009 (JP) ................. 2009-181870

(51) Int. Cl.
*G03C 5/00* (2006.01)
(52) U.S. Cl. .......... 430/30; 430/296; 430/313; 430/328; 430/394; 430/942
(58) Field of Classification Search .................... 430/30, 430/296, 313, 328, 394, 942
See application file for complete search history.

(56) References Cited

U.S. PATENT DOCUMENTS

| 2002/0177056 A1 | 11/2002 | Ogino et al. |
| 2007/0196768 A1 | 8/2007 | Ogino |

FOREIGN PATENT DOCUMENTS

| JP | 2002-353101 A | 12/2002 |
| JP | 2003-332225 A | 11/2003 |
| JP | 2007-227564 A | 9/2007 |

OTHER PUBLICATIONS

S. Manakli et al., "New Electron Beam Proximity Effects Correction Approach for 45 and 32 nm Nodes", Japanese Journal of Applied Physics, Aug. 4, 2006, pp. 6462-6467, vol. 45 No. 8A.

*Primary Examiner* — Christopher Young
(74) *Attorney, Agent, or Firm* — Westerman, Hattori, Daniels & Adrian, LLP

(57) ABSTRACT

A charged particle beam exposure method that includes preparing of exposure data for a plurality of device patterns; obtaining of an integral of forward scattering components in an exposure intensity distribution with each of the device patterns near the center of the exposure intensity distribution as domain of integration; correcting of the shape of each of the plurality of device patterns by correcting the exposure data, so that the integral is equal to a reference value; and appropriating of mask patterns within an exposure mask to each of the device patterns following the correction, such that the center of gravity of each of the device patterns matches the center of gravity of the mask pattern appropriated thereto.

11 Claims, 40 Drawing Sheets

FIG.9
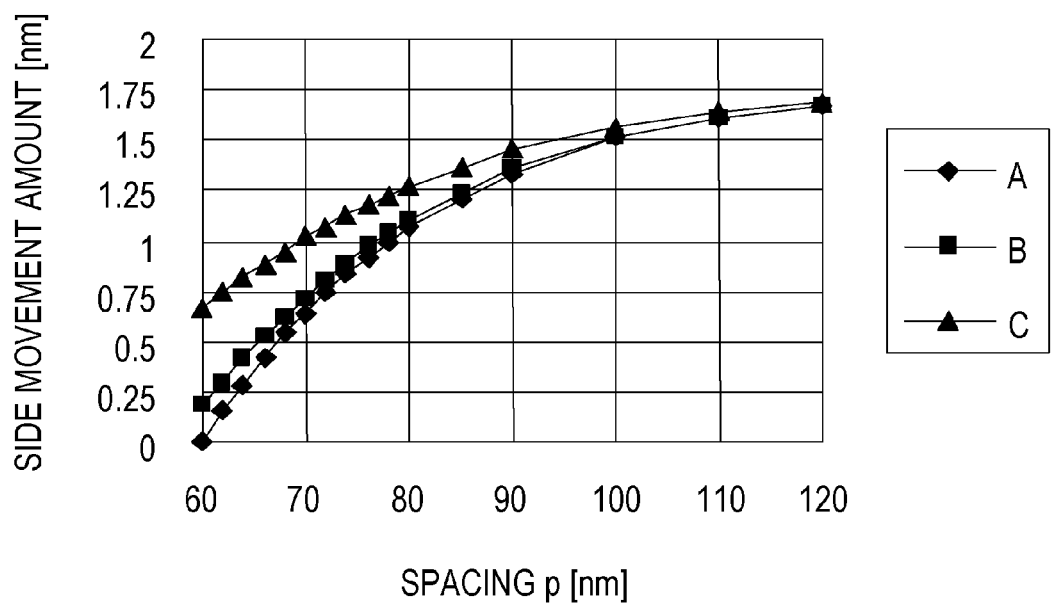
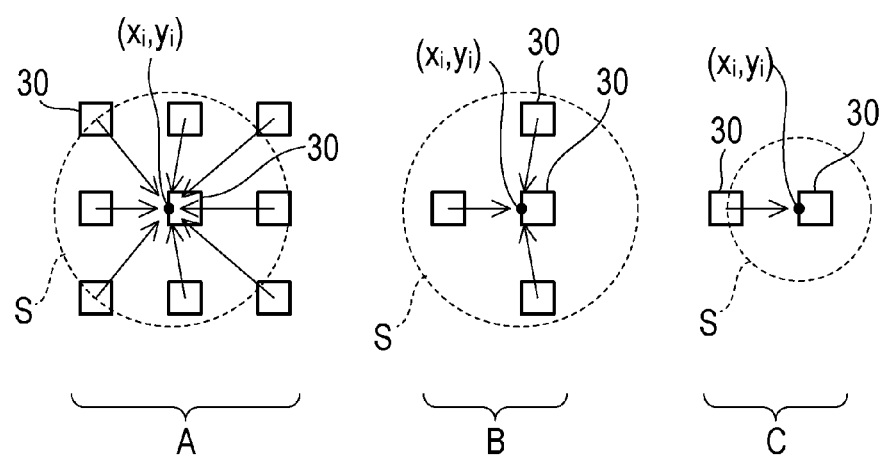

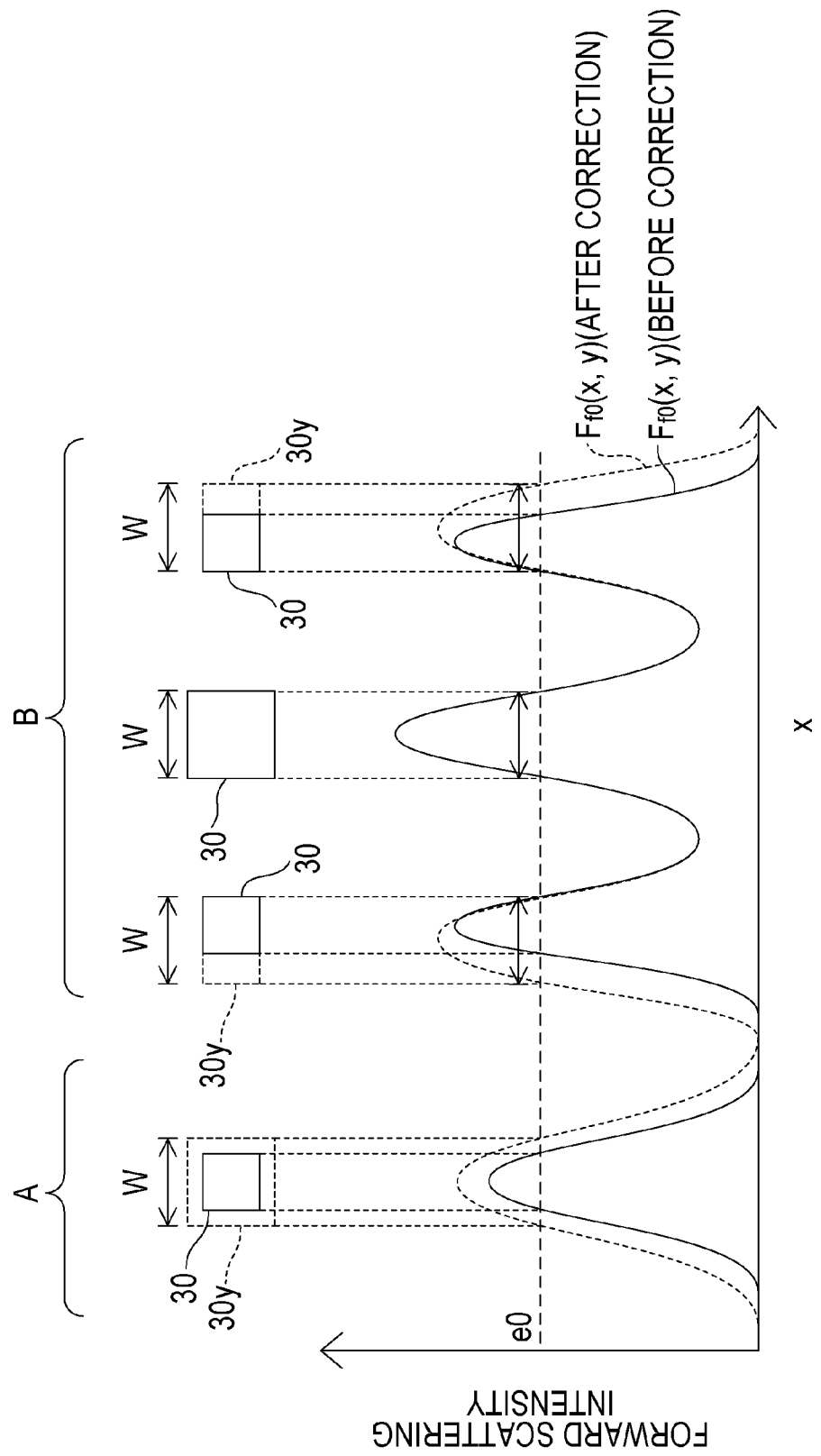

FIG.21
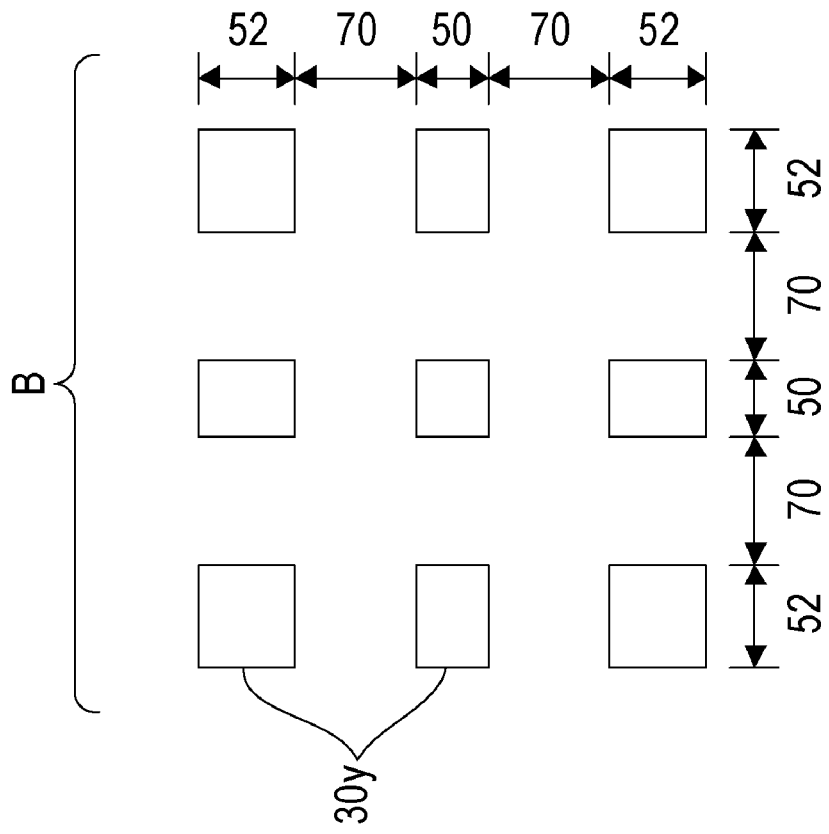
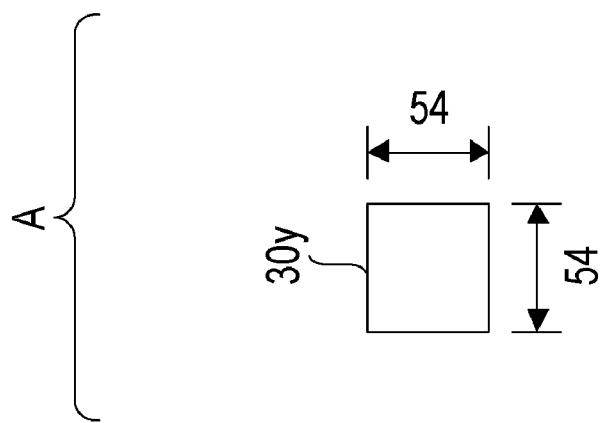

EXPOSURE METHOD USING CHARGED PARTICLE BEAM

CROSS-REFERENCE TO RELATED APPLICATIONS

This application is based upon and claims the benefit of priority of the prior Japanese Patent Application No. 2009-181870, filed on Aug. 4, 2009 the entire contents of which are incorporated herein by reference.

FIELD

The present invention relates to an exposure method using charged particle beam, and a method for manufacturing a semiconductor device using the exposure method.

BACKGROUND

Exposure devices which perform exposure of resist include light exposure devices and electron beam exposure devices. Of these, electron beam exposure devices do not require the use of reticles as with the case of light exposure devices, allowing the time and cost involved in fabricating the reticle to be eliminated, which is suitable for small-lot production as in the case of engineering samples.

Such electron beam exposure devices use what is known as "block exposure", in which multiple mask patterns used frequently are formed as a block mask, and the multiple mask patterns are exposed in batch fashion, to improve throughput.

However, finer design of semiconductor devices has led to finer patterns, which may result in incident electrons to adjacent mask patterns scattering within the resist, with the completed resist pattern form not being able to realize the target form due to the so-called "proximity effect".

One attempt to suppress this proximity effect is to adjust the position of the sides of the mask patterns arrayed in the block mask so as to prevent the adjacent mask patterns from affecting one another. However, with this method the mask patterns of the block mask become unusable for other types of exposure objects in the event that the type to be exposed is changed, meaning that a different block mask has to be used for each type, which defeats the advantage with regard to time and cost.

Another attempt to suppress the proximity effect is to indiscriminately reduce the size of the mask patterns arrayed in the block pattern. However, the proximity effect affects different portions on the masks in different ways, so simply indiscriminately reducing the size of the all of the mask patterns may not be able to suppress the proximity effect at all of the masks.

On the other hand, there is also a method for performing auxiliary exposure for supplementing exposure of portions where the proximity effect is small and exposure is insufficient. With this method, a mask pattern within a block mask is finely divided into small regions, auxiliary exposure amount appropriate for each small region is calculated, and auxiliary exposure is performed for each small region. However, a great amount of time is required for calculating the auxiliary exposure, and further, a great deal of resources within the calculator for performing the calculations, such as memory, is occupied. Moreover, this method is also disadvantageous in that the number of shots increase due to the auxiliary exposure, and the throughput of the electron beam exposure device decreases.

Also, there is a method in which the effects of scattering electrons on the resist is taken into consideration, and in the event that there is a mask pattern in an already-existing block mask which is close in form to the target resist pattern, that mask pattern is used to perform exposure. However, with this usage, proximity effect between adjacent mask patterns is not taken into consideration, so in the event that the proximity effect is great, the form of the completed resist pattern form is not able to realize the target form.

Thus, there is demand for a charged particle beam exposure method wherein exposure data is corrected taking the proximity effect into consideration.

SUMMARY

According to one aspect of the invention, a charged particle beam exposure method includes preparing of exposure data for a plurality of device patterns; obtaining of an integral of forward scattering components in an exposure intensity distribution with each of said device patterns near the center of said exposure intensity distribution as domain of integration; correcting of the shape of each of said plurality of device patterns by correcting said exposure data, so that said integral is equal to a reference value; appropriating of mask patterns within an exposure mask to each of said device patterns following said correction, such that the center of gravity of each of said device patterns matches the center of gravity of the mask pattern appropriated thereto; appropriating of exposure amounts to said mask patterns following said appropriation of said mask patterns to each of said device patterns, so that a resist pattern, having a design width in a resist layer exposed by charged particles passing through said mask patterns, is obtained; and exposing of said resist layer based on said exposure data following said appropriation of exposure amounts.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF THE DRAWINGS

FIG. 9 is a graph illustrating the relation between the spacing between two device patterns before correction, and the amount of movement of sides following correction, according to the first embodiment;

FIG. 10 is a graph schematically illustrating the forward scattering intensity $F_{f0}(x, y)$ before and after correction according to the first embodiment;

FIG. 21 is a plan view illustrating the placement of disk patterns following correction, obtained by performing steps S1 through S3 according to the first embodiment;

DETAILED DESCRIPTION OF THE EMBODIMENTS

First Embodiment

Figure 1:
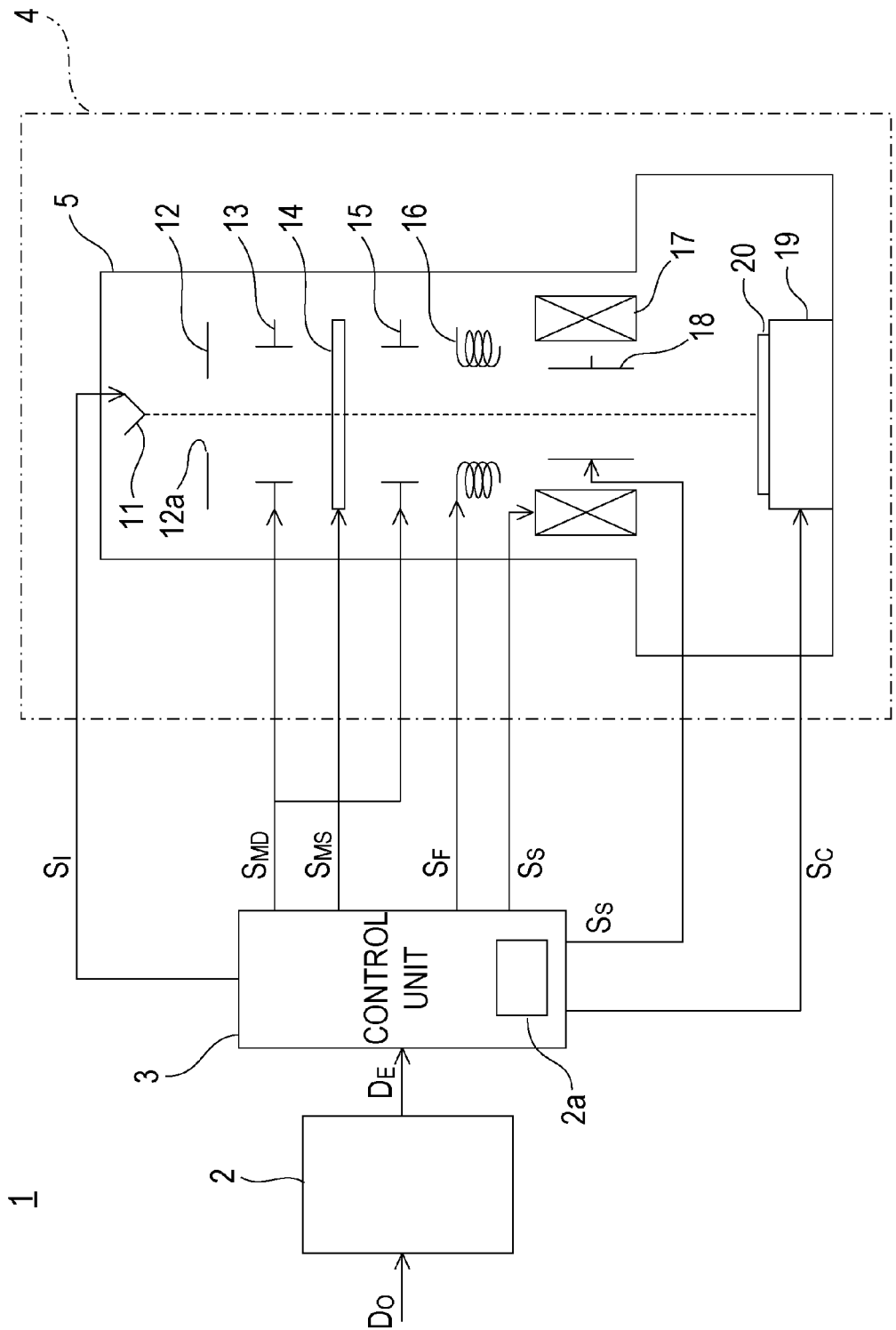
FIG. 1 is a configuration diagram of an electron beam exposure device according to a first embodiment.

FIG. 1 is a configuration diagram of an electron beam exposure device 1 used with the present embodiment.

The electron beam exposure device 1 has an exposure data creating unit 2, a control unit 3, and an electronic optical system 4.

Of these, the electronic optical system 4 has a column 5 of which the interior is depressurized, and an electron gun 11 is provided within the column 5 for generating an electron beam EB.

A shaping mask 12 in which an aperture 12a has been formed is provided downstream from the electron gun 11. The planar shape of the aperture 12a is a rectangular shape, so the electron beam EB passing through the shaping mask 12 is shaped to a rectangular shape.

Downstream from the shaping mask 12 is a first mask deflector 13, an exposure mask 14, and a second mask deflector 15. The electron beam EB is deflected by the deflectors 13 and 15, so as to be deflected to a mask pattern at a predetermined position within the exposure mask 14.

Note that the exposure mask 14 is connected to unshown driving means, and is arranged so as to be capable of moving on a horizontal plane so that the electron beam EB is cast onto the later-described mask pattern. The driving means are primarily used for adjusting the position of the exposure mask 14 before starting exposure, and during exposure the first mask deflector 13 and second mask deflector 15 deflect the electron beam EB to a predetermined mask pattern of the exposure mask 14.

Downstream of the second mask deflector 15 are provided a focus range 16 for focusing the focal point of the electron beam EB onto the surface of a semiconductor substrate 20, and a first deflector 17 and second deflector 18 for deflecting the electron beam EB to a predetermined portion of the semiconductor substrate 20.

Note that the semiconductor substrate 20 is loaded on a stage 19, and moves on a horizontal plane by way of the stage 19.

With such a electron beam exposure device 1, the exposure data creating unit 2 creates exposure data $D_E$ based on design data $D_O$ of a device pattern. The design data $D_O$ includes the positions and shapes of device patterns such as contact holes and the like. The exposure data $D_E$ includes the amount of exposure, the amount of deflection of the electron beam EB, and so forth, for obtaining the device pattern determined by the design data $D_O$.

Note that the exposure data creating unit 2 includes a storage unit 2a used for correcting the exposure data $D_E$ as described later.

The control unit 3 outputs control signals to each part of the electronic optical system 4 based on the exposure data $D_E$.

For example, the intensity of the electron beam EB generated at the electron gun 11 is controlled by an intensity signal $S_I$.

Also, the amount of deflection of the electron beam EB on the block mask is controlled by a mask deflection signal $S_{MD}$. Further, the amount of movement of the block mask 14 is controlled by a mask movement signal $S_{MS}$, and the focal point of the electron beam EB is controlled by a focus signal $S_F$. The amount of deflection of the electron beam EB on the semiconductor substrate 20 is controlled by a substrate deflection signal $S_S$, and the amount of movement of the stage 19 is controlled by a state control signal $S_C$.

Figure 2:
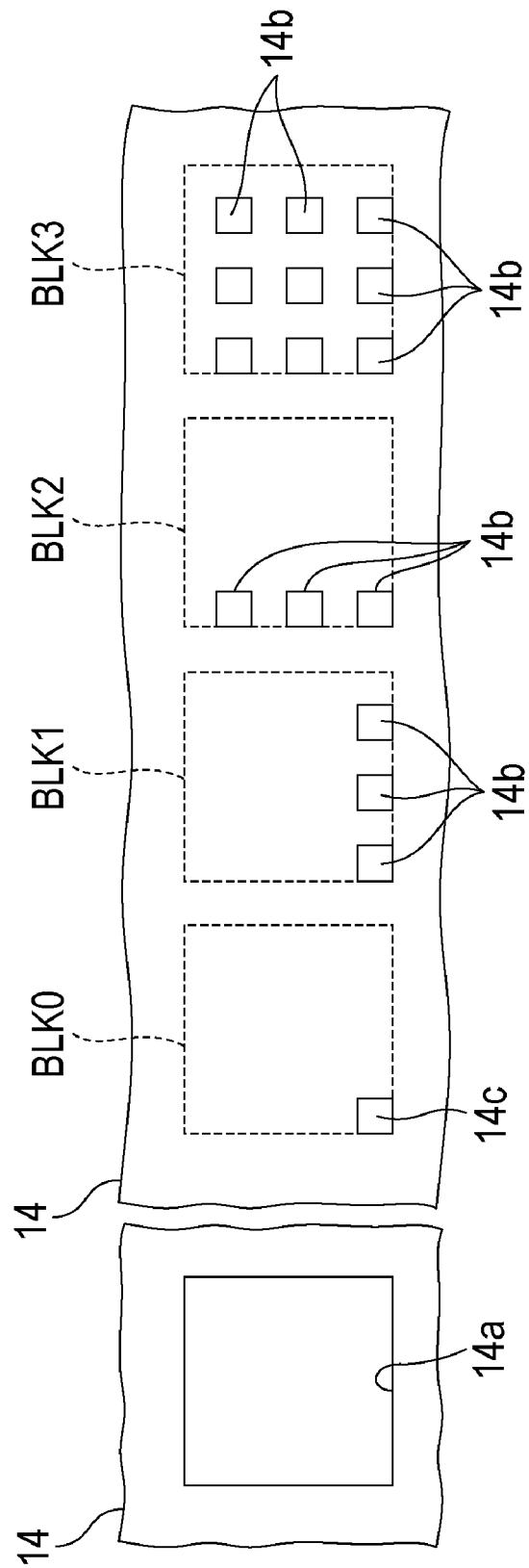
FIG. 2 is an enlarged plan view of principal portions of a block mask according to the first embodiment.

FIG. 2 is an enlarged plan view of the above-described block mask 14.

The block mask 14 has formed therein an aperture 14a and mask patterns 14b.

Of these, the aperture 14a has a rectangular planar shape, and is used for performing variable-shaped rectangular exposure as described later.

On the other hand, the mask patterns 14b correspond to device patterns such as contact holes, and are formed in increments of blocks in accordance with a pitch and number of which the frequency of usage with regard to devices is high.

For example, with this example, first through third blocks BLK1 through BLK3 are defined, with three mask patterns 14b being formed for the first block BLK1 and second block BLK2. With the third block BLK3, mask patterns 14b are formed in an array of 3 by 3.

Further, with the present embodiment, a representative block BLK0 used at the time of correcting the exposure data, which will be described later, is also defined. The representative block BLK0 has just one representative mask pattern 14c formed.

While the size and planar shape of the representative mask pattern 14c are not restricted in particular, with the present embodiment, the representative mask pattern 14c is formed as a square having the same size as the mask patterns 14b in the other blocks BLK1 through BLK3. With the present embodiment, the representative mask pattern 14c is formed in a square shape with each side being 4 μm or shorter, so as to fit into the representative block BLK0.

Figure 3:
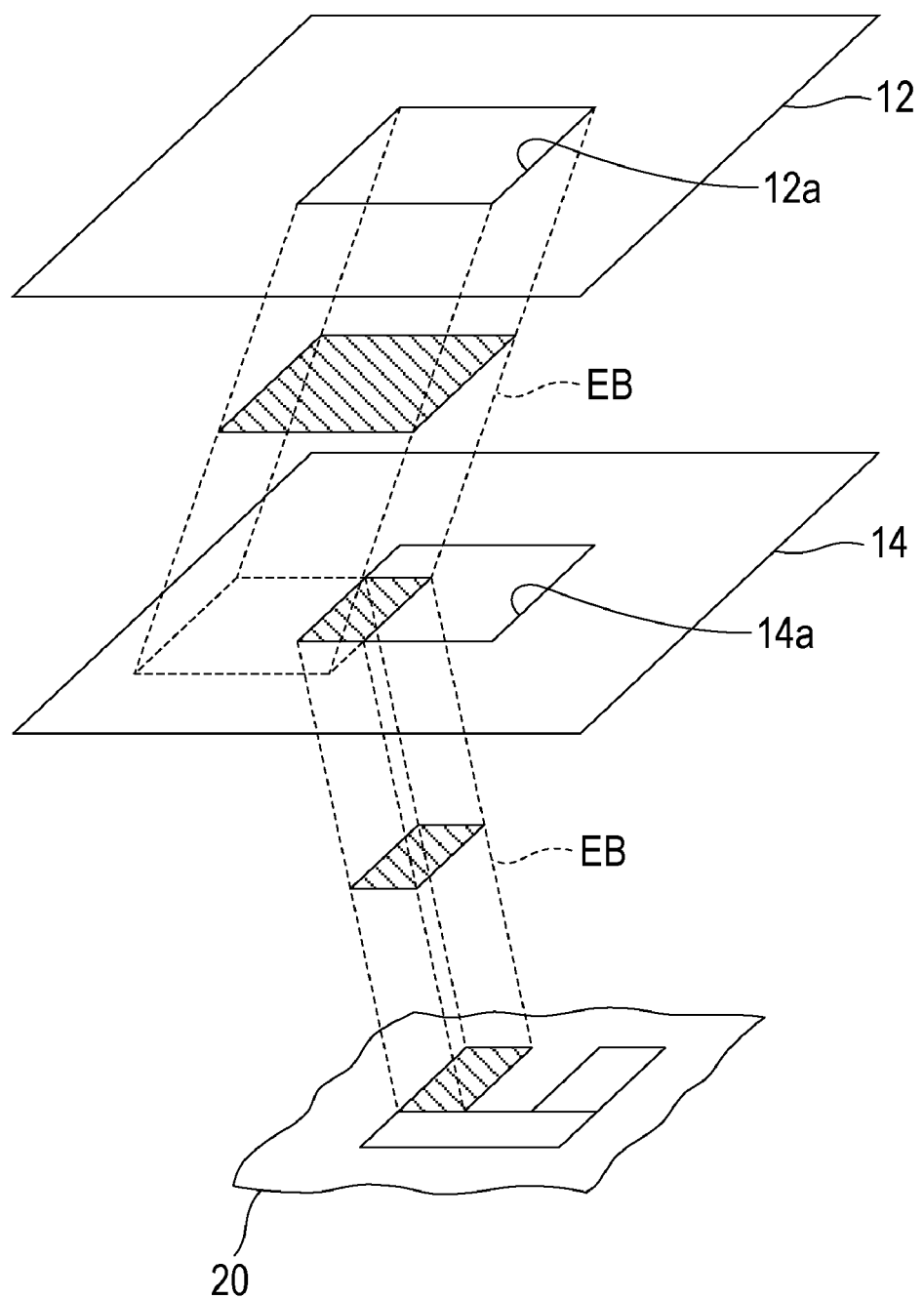
FIG. 3 is a perspective diagram for describing variable-shaped rectangular exposure.

FIG. 3 is a perspective diagram for describing variable-shaped rectangular exposure using the block mask 14.

With variable-shaped rectangular exposure, a part of an electron beam EB which has been shaped at an aperture 12a is passed through the aperture 14a of the block mask 14, thereby rendering a shape corresponding to the overlapping part between the aperture 12a and the aperture 14a on the semiconductor substrate 20.

Figure 4:
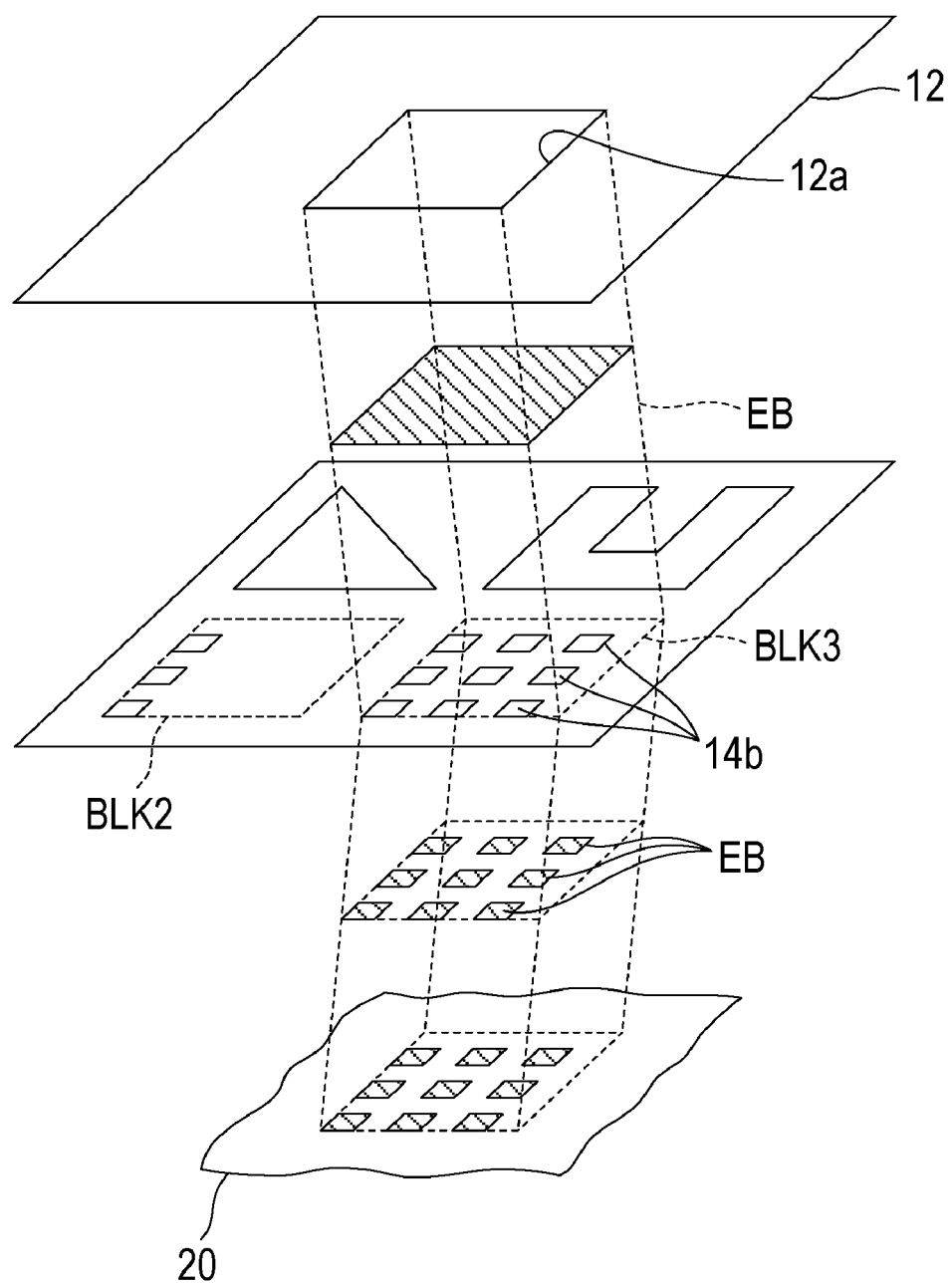
FIG. 4 is a perspective diagram for describing block exposure.

On the other hand, FIG. 4 is a perspective view for describing block exposure using the block mask 14.

With block exposure, the electron beam EB is cast on each of the blocks BLK1 through BLK4, and the mask patterns 14b are rendered on the semiconductor substrate 20 in batch fashion by the electron beam EB which has passed through the blocks BLK1 through BLK4.

Note that when performing block exposure, the proximity effect occurs, wherein electron beams EB which have passed through adjacent mask patterns 14b within the same block affect each other. Due to the proximity effect, the width of the resist pattern in the semiconductor substrate 20 is not the same as the designed width.

With the present embodiment, the exposure data $D_E$ is corrected at the exposure data creating unit 2 (see FIG. 1) as described below to suppress the proximity effect.

Figure 5:
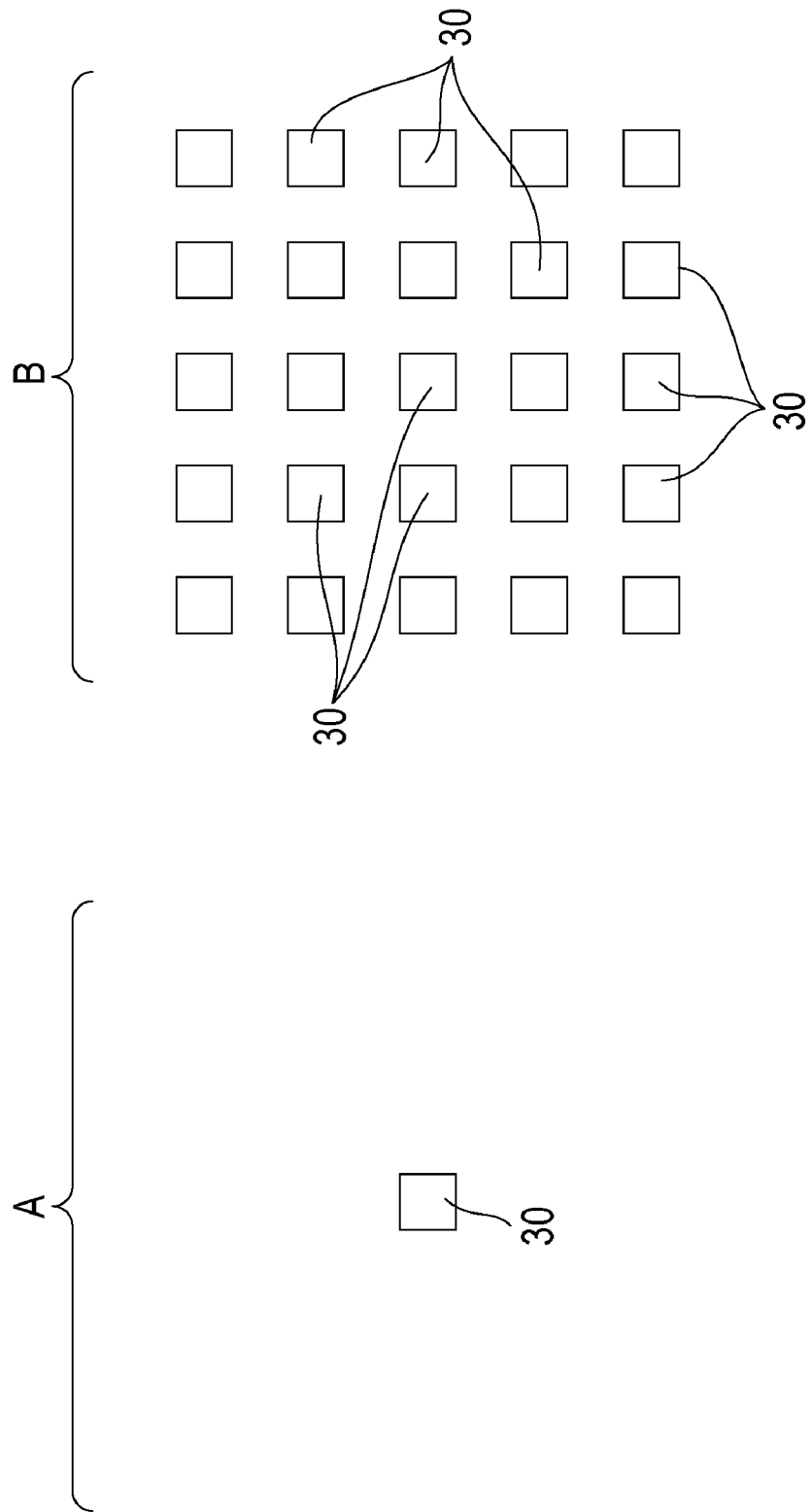
FIG. 5 is a plan diagram illustrating example of device pattern array according to the first embodiment.

In the following, this correction method will be described with reference to an example of a case wherein the device patterns are arrayed as illustrated in FIG. 5.

FIG. 5 is a plan view illustrating an example of the array of device patterns 30. The device patterns 30 are, for example, contact holes, and in this example are arrayed in a region A where pattern density is low and a region B where pattern density is high.

Figure 6:
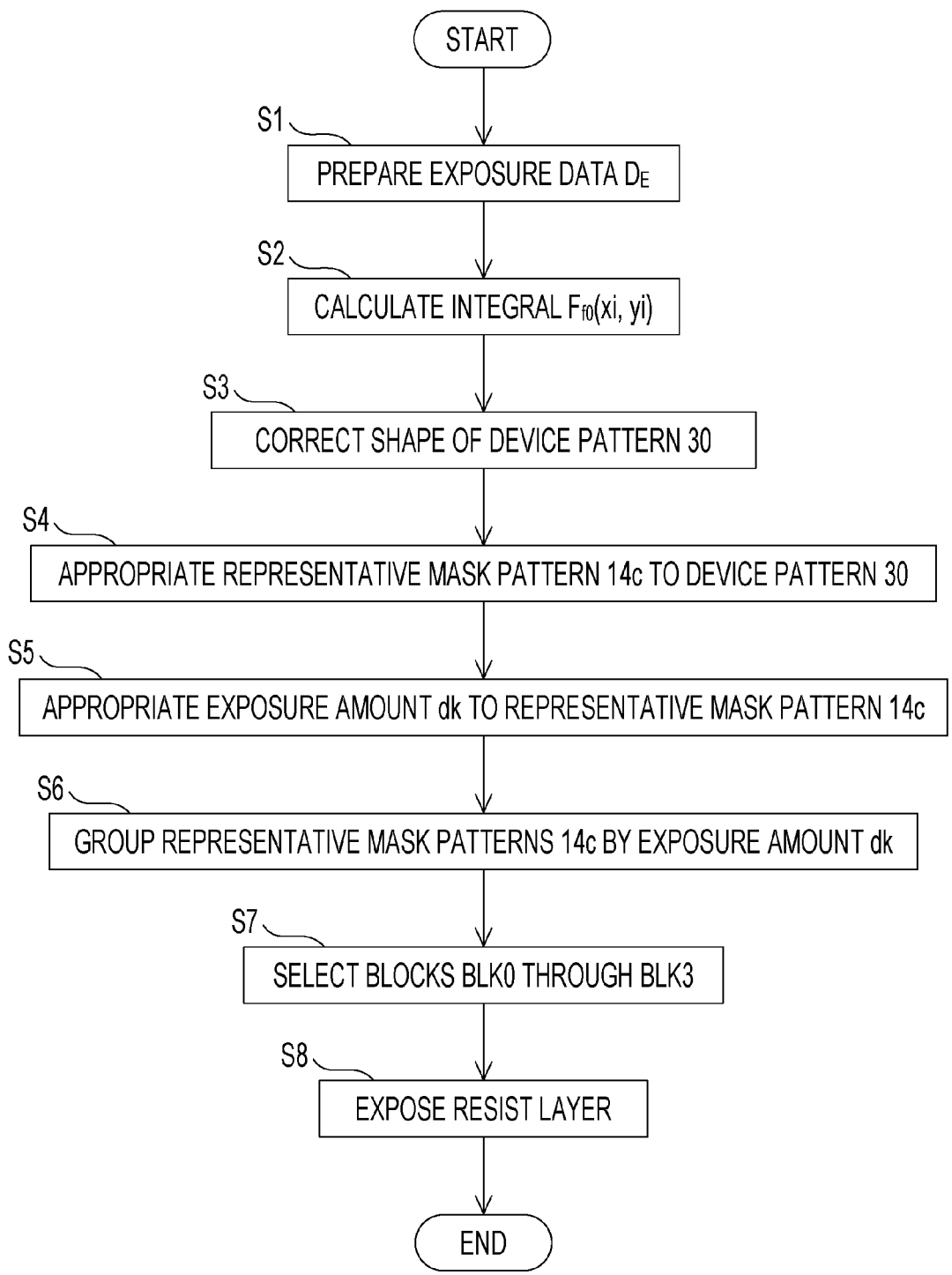
FIG. 6 is a flowchart illustrating a correction method for exposure data according to the first embodiment.

Also, FIG. 6 is a flowchart illustrating an exposure method according to the present embodiment.

First, in the first step S1, the above-described exposure data $D_E$ is prepared at the exposure data creating unit 2.

Next, in step S2, the exposure data $D_E$ is corrected taking into consideration the proximity effect, as described below.

In order to take the proximity effect into consideration, it is necessary to consider the effect that incident electrons to a point of the resist layer have on the surroundings thereof. The effects may be comprehended by the exposure intensity distribution defined by the following Expression (1).

$$f(x, y) = \frac{1}{\pi \beta_f^2} \exp\left(-\frac{x^2 + y^2}{\beta_f^2}\right) + \frac{\eta_a}{\pi \beta_a^2} \exp\left(-\frac{x^2 + y^2}{\beta_a^2}\right) + \frac{\eta_b}{\pi \beta_b^2} \exp\left(-\frac{x^2 + y^2}{\beta_b^2}\right) \quad (1)$$

In Expression (1), f(x, y) represents the amount of energy per unit area accumulated in the resist layer at a point (x, y) due to the incident electrons at a point (0, 0) of the resist layer, and is also called an EID (Exposure Intensity Distribution) function.

Accumulation of energy in the resist layer may be understood as being the sum of effects due to forward scattered electrons and effects due to backscattered electrons.

Figure 7:
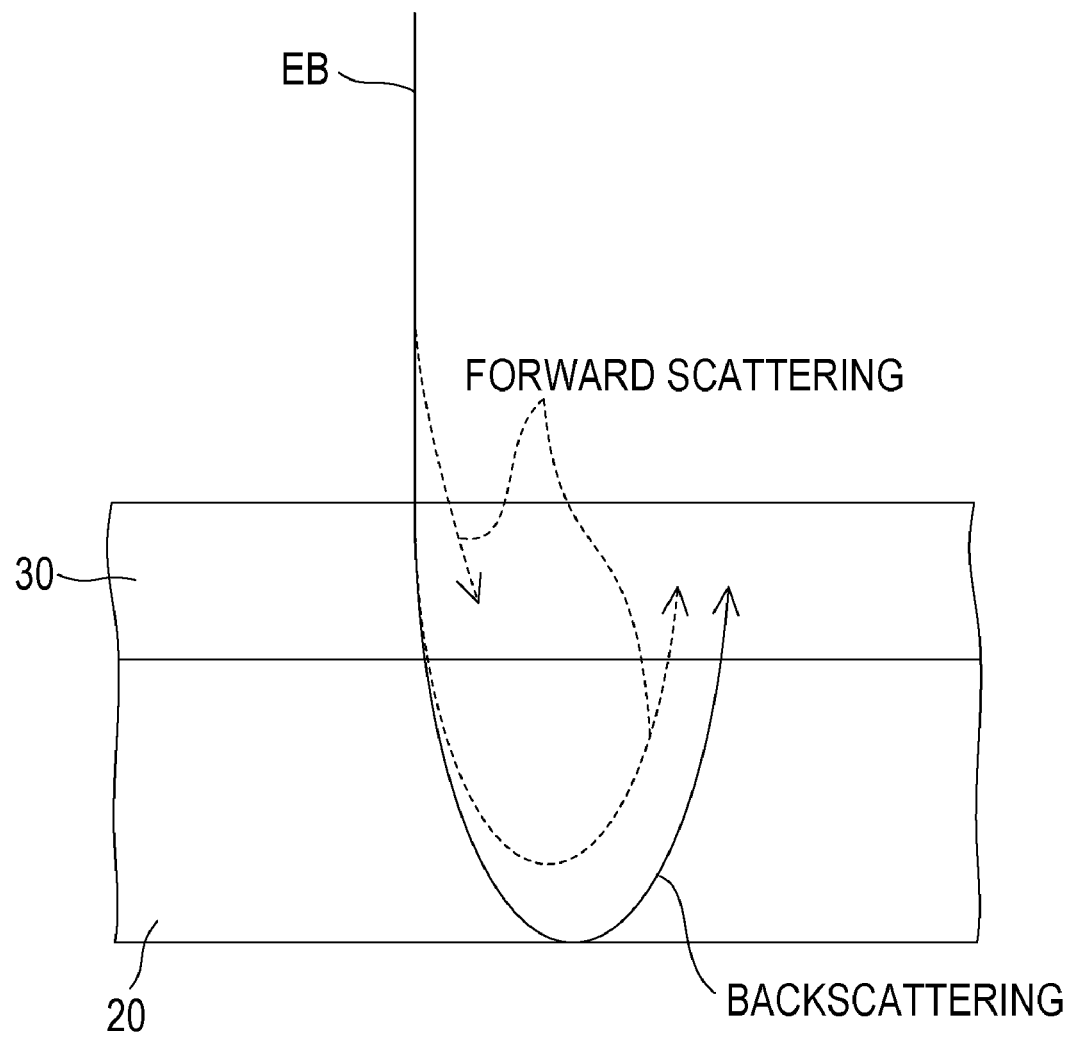
FIG. 7 is a cross-sectional diagram for describing forward scattering and backscattering.

FIG. 7 is a cross-sectional diagram for describing forward scattering and backscattering of electrons.

As illustrated in FIG. 7, upon the electron beam EB being cast into the resist layer 30 formed on the substrate 20, there are electrons which reflect deep in the substrate 20 and return to the resist layer 30 again, and those which reflect near the surface of the substrate 20 and return to the resist layer 30 again.

Accordingly, the energy accumulated in the resist layer 30 is the sum of the energy from electrons before such reflection and the energy from electrons following reflection.

With the present embodiment, the energy accumulated in the resist layer 30 due to electrons reflecting deep in the substrate 20 will be defined as backscattering component $f_b(x, y)$. Also, the energy accumulated in the resist layer 30 due to electrons passing through the resist layer 30 before reflecting and due to electrons reflecting near the surface of the substrate 20 will be defined as forward scattering component $f_f(x, y)$.

In the EID function in Expression (1), the sum of the first term and second term to the right side are equivalent to the forward scattering component $f_f(x, y)$, and the third term to the right side is equivalent to the backscattering component $f_b(x, y)$. Accordingly, the following Expressions (2) and (3) hold.

$$f_f(x, y) = \frac{1}{\pi \beta_f^2} \exp\left(-\frac{x^2 + y^2}{\beta_f^2}\right) + \frac{\eta_a}{\pi \beta_a^2} \exp\left(-\frac{x^2 + y^2}{\beta_a^2}\right) \quad (2)$$

$$f_b(x, y) = \frac{\eta_b}{\pi \beta_b^2} \exp\left(-\frac{x^2 + y^2}{\beta_b^2}\right) \quad (3)$$

In Expressions (1) through (3), $\beta_f$ represents a first forward scattering diameter, representing the energy accumulated in the resist layer 30 due to electrons passing through the resist layer 30. Also, $\beta_f$ represents a second forward scattering diameter, representing the energy accumulated in the resist layer 30 due to electrons reflected near the surface of the substrate 20. On the other hand, $\beta_b$ represents a backscattering diameter, representing the energy accumulated in the resist layer 30 due to electrons reflected deep within the substrate 20.

Also, $\eta_a$ represents a second forward scattering ratio and $\eta_b$ represents a backscattering ratio.

Figure 8:
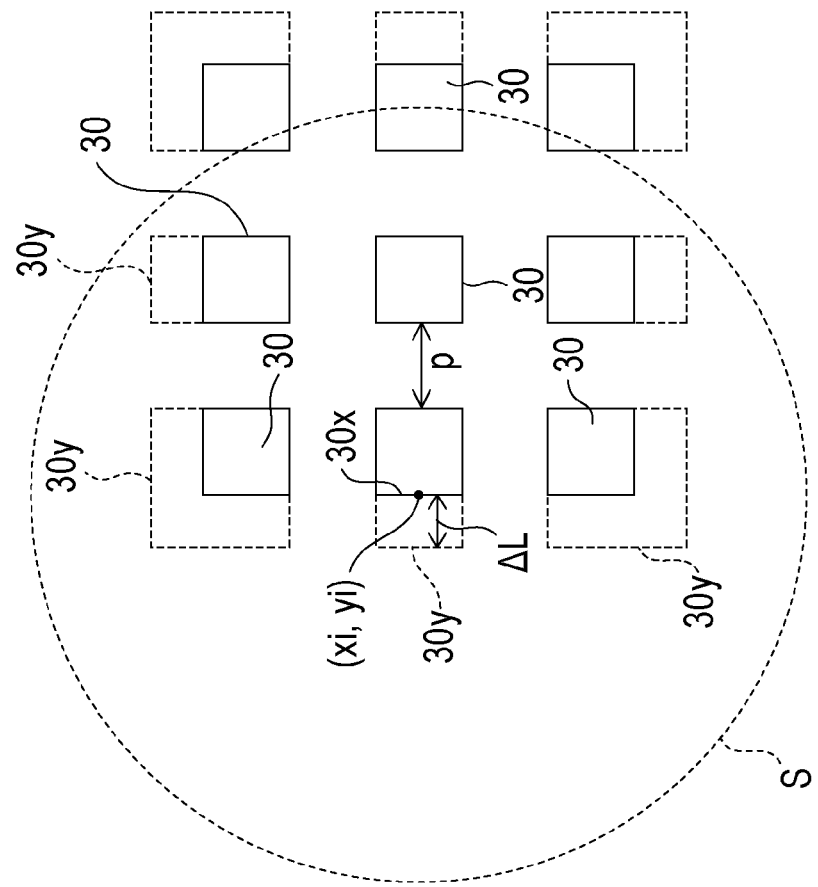
FIG. 8 is a partially enlarged plan view of FIG. 5.

In step S2, of the effects which incident electrons to one point of the resist layer 30 have on the surrounding resist layer 30, those due to the forward scattering component $f_f(x, y)$ in Expression (2) will be taken into consideration within the range of a region S illustrated in FIG. 8.

FIG. 8 is a partially enlarged plan view of FIG. 5.

As illustrated in FIG. 8, the region S is a circular region with its center coordinates $(x_i, y_i)$ on one side 30$x$ of one device pattern 30. The region S is set so as to overlap with multiple device pattern 30 near the device pattern 30 where the center coordinates $(x_i, y_i)$ exist.

With this region S as a domain of integration, the integral $F_{f0}(xi, yi)$ represented by the following Expression (4) is calculated.

$$F_{f0}(x, y) = \int \int_S p(x', y') f_f(xi - x', yi - y') dx' dy' \quad (4)$$

In Expression (4), the function p is defined by the following Expression (5).

$$p(x', y') = \begin{cases} 1 & ((x', y') \in \text{device pattern 30}) \\ 0 & ((x', y') \notin \text{device pattern 30}) \end{cases} \quad (5)$$

That is to say, in the event that the point (x', y') belongs to any device pattern 30, p(x', y') is equal to 1, and otherwise, p(x', y') is equal to 0.

From the nature of this function p(x', y'), the integral $F_{f0}(xi, yi)$ in Expression (4) is equivalent to an integral obtained by integrating the forward scattering component $f_f(x, y)$ of the exposure intensity distribution with each of the device patterns 30 near the center $(x_i, y_i)$ of the exposure intensity distribution as a domain of integration. Note that the center $(x_i, y_i)$ may also be referred to as evaluation point $(x_i, y_i)$ in the following.

The integral $F_{f0}(x_i, y_i)$ defined in this way is called forward scattering intensity.

Next, the flow advances to step S3.

In step S3, the shape of each device pattern 30 is corrected so that the forward scattering intensity $F_{f0}(x_i, y_i)$ is equal to a reference value e0. This sort of correction is performed sequentially by moving the sides of the devices patterns 30, and the correction ends in the event that there is no substantial difference between the amount of movement ΔL the n'th time and the amount of movement ΔL the n+1'th time.

FIG. 8 illustrates device patterns 30$y$ following such shape correction with dotted lines.

Alternatively, the shapes of the device patterns 30 may be corrected with rule-based correction, instead of the sequential calculation described above.

Table 1 is an example of a table used with such rule-based correction.

TABLE 1

| Spacing p | p < 70 nm | 70 nm ≦ p < 80 nm | 80 nm < p |
|---|---|---|---|
| Amount of movement ΔL of side | 0 nm | 1 nm | 2 nm |

This table is stored in the storage unit 2$a$ of the exposure data creating unit 2 (see FIG. 1), and is created using the graphs illustrated in FIG. 9.

The graphs A through C illustrated in FIG. 9 illustrate the relation between the spacing p between two device patterns 30 before correction, and the amount of movement ΔL of the sides after correction. Also, schematic drawings for describing the significance of the graphs A through C are provided to the lower side of FIG. 9.

Of these, graph A is of a case wherein, in addition to the device pattern 30 where the center $(x_i, y_i)$ is situated, eight adjacent device patterns are also overlapped with the domain of integration S. Also, graph B is of a case wherein, in addition to the device pattern 30 where the center $(x_i, y_i)$ is situated, three adjacent device patterns 30 are also overlapped with the domain of integration S. Further, graph C is of a case wherein, in addition to the device pattern 30 where the center $(x_i, y_i)$ is situated, just one adjacent device pattern 30 is also overlapped with the domain of integration S.

In these graphs, the vertical axis represents the movement amount ΔL of the sides of the device patterns 30 when the forward scattering intensity $F_{f0}(x_i, y_i)$ in Expression (4) is the already-described reference value e0.

In the event of actually correcting the exposure data $D_E$, moving the sides of the device patterns 30 in steps of whole numbers for the movement amount is easier than moving the sides in a continuous manner.

For example, in graph C in FIG. 9, in the event that p<70 nm, the ΔL smaller than the decimal is ignored and ΔL is taken to be 0 nm. Also, in the event that 70 nm p<80 nm, the ΔL smaller than the decimal is ignored and ΔL is taken to be 1 nm. Moreover, in the event that 80 nm<p, the ΔL after the decimal is truncated and ΔL is taken to be 2 nm. The Table 1 above is a compilation of this.

In this step S3, the sides of the device patterns 30 are moved by a movement amount ΔL by rule-based correction using such a table, or numerical value calculation using Expression (4).

FIG. 10 is a graph schematically illustrating the forward scattering intensity $F_{f0}(x, y)$ before and after correction.

Note that in FIG. 10, the number of device patterns 30 to be corrected in the high-density region B is illustrated as being three, to simplify the drawing.

As illustrated in FIG. 10, before correction, the forward scattering intensity $F_{f0}(x, y)$ in the high-density region B is shifted above that in the low-density region A. This is because in the high-density region B, the device patterns 30 are each affected by adjacent device patterns 30.

On the other hand, in the low-density region A before correction, there is no effect from another device pattern 30, so the forward scattering intensity $F_{f0}(x, y)$ is shifted downwards as compared with the high-density region B.

After correction, the width W of the graph of which the reference value e0 is set as the slice level is the same for each of the device patterns 30$y$.

Accordingly, performing exposure using this corrected exposure data $D_E$ allows the device patterns 30 to be resolved with the same width on the resist layer without the image size loosing uniformity due to the proximity effect.

However, performing such correction means that the device patterns 30$y$ of which the side lengths have become different from one another due to correction have to be individually rendered, so batch exposure in block units cannot be performed, resulting in lowered throughput of the electron beam exposure device.

Accordingly, with the present embodiment, post-correction device patterns 30$y$ are rendered using a representative mask pattern 14$c$ as described below, and excessive/insufficient exposure is corrected separately.

Figure 11A:
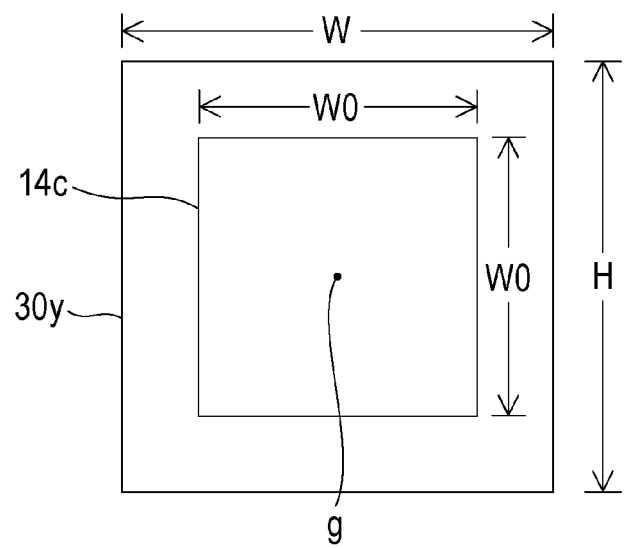
FIGS. 11A and 11B are plan views illustrating how a representative mask pattern is appropriated to a device pattern according to the first embodiment.

First, in step S4, a representative mask pattern 14$c$ (see FIG. 2) is appropriated to each device pattern 30$y$ in the exposure data $D_E$ following correction so that the center of gravity g match with the device pattern 30, as illustrated in FIG. 11A. Note that FIG. 11A assumes a case wherein the planar shape of the post-correction device pattern 30y is a square.

Next, we will consider the forward scattering intensity $F_f(x, y, W, H)$ in order to comprehend the effects that the electrons which have passed through the representative mask pattern 14c have on the resist layer.

$$F_f(x, y, W, H) = \int_{-H/2}^{+H/2} \int_{-W/2}^{+W/2} f_f(x-x', y-y')dx'dy' \quad (6)$$

$$= \frac{1}{4}\left\{\mathrm{erf}\left(\frac{W/2-x}{\beta_f}\right) + \mathrm{erf}\left(\frac{W/2+x}{\beta_f}\right)\right\}$$

$$\left\{\mathrm{erf}\left(\frac{H/2-y}{\beta_f}\right) + \mathrm{erf}\left(\frac{H/2+y}{\beta_f}\right)\right\} +$$

$$\frac{\eta_a}{4}\left\{\mathrm{erf}\left(\frac{W/2-x}{\beta_a}\right) + \mathrm{erf}\left(\frac{W/2+x}{\beta_a}\right)\right\}$$

$$\left\{\mathrm{erf}\left(\frac{H/2-y}{\beta_a}\right) + \mathrm{erf}\left(\frac{H/2+y}{\beta_a}\right)\right\}$$

The forward scattering intensity $F_f(x, y, W, H)$ defined in Expression (6) is restricted to one device pattern 30y which is the object of the domain of integration, unlike the forward scattering intensity $F_{f0}(x, y)$ defined in Expression (4).

That is to say, this forward scattering intensity $F_f(x, y, W, H)$ represents the forward scattering component of the energy accumulated in the resist layer at a point (x, y) in a case in which the electron beam is uniformly cast on a device pattern 30y with a width of W and a height of H. The forward scattering intensity $F_f(x, y, W, H)$ is a function regarding a distance (x, y) from the center (0, 0) of the device pattern 30y.

Using this forward scattering intensity $F_f(x, y, W, H)$, the design width W' of the resist pattern satisfies the following Expression (7).

$$e0 = F_f(W'/2, 0, W, W) \quad (7)$$

That is to say, when the distance x from the center of the device pattern 30y is ½ of the design width W', the forward scattering intensity is the reference value e0.

Figure 11B:
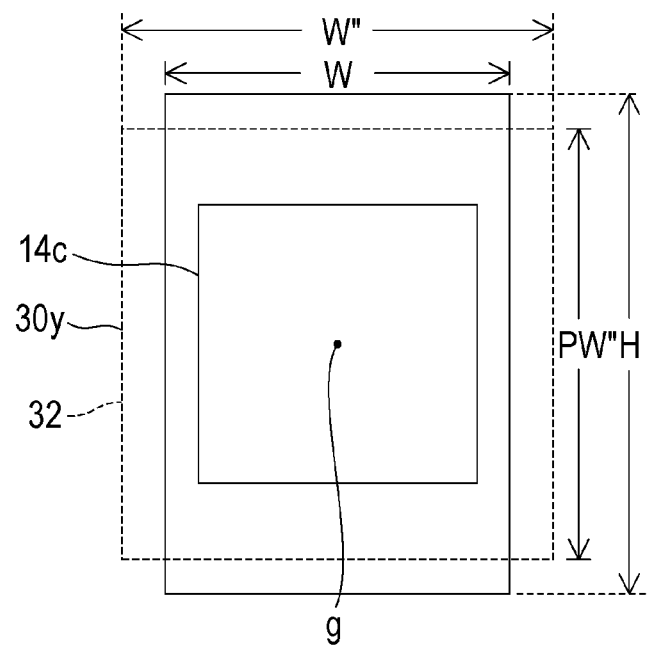

Note that the shape of the post-correction device pattern 30y may not be a square, and may be a rectangle of which the lengths of the sides W and H differ, as illustrated in FIG. 11B. In this case, a hypothetical square 32 with the same area as the post-correction device pattern 30y is conceived as illustrated by the dotted lines in FIG. 11B. The width W" of one side of this hypothetical square 32 is $(W \times H)^{1/2}$. This width W" is then substituted into the width W in Expression (7), and the subsequent calculation is performed.

Next, W" in Expression (7) is used to calculate the forward scattering intensity ek for each of the representative mask patterns 14c, using the following Expression (8).

$$ek = F_f(W'/2, 0, W0, W0) \quad (8)$$

W0 in Expression (8) is the width of one side of a representative mask pattern 14c which is a square. Also, the k in ek is a suitable integer serving as an additional character to group the same forward scattering intensities together.

Figure 12:
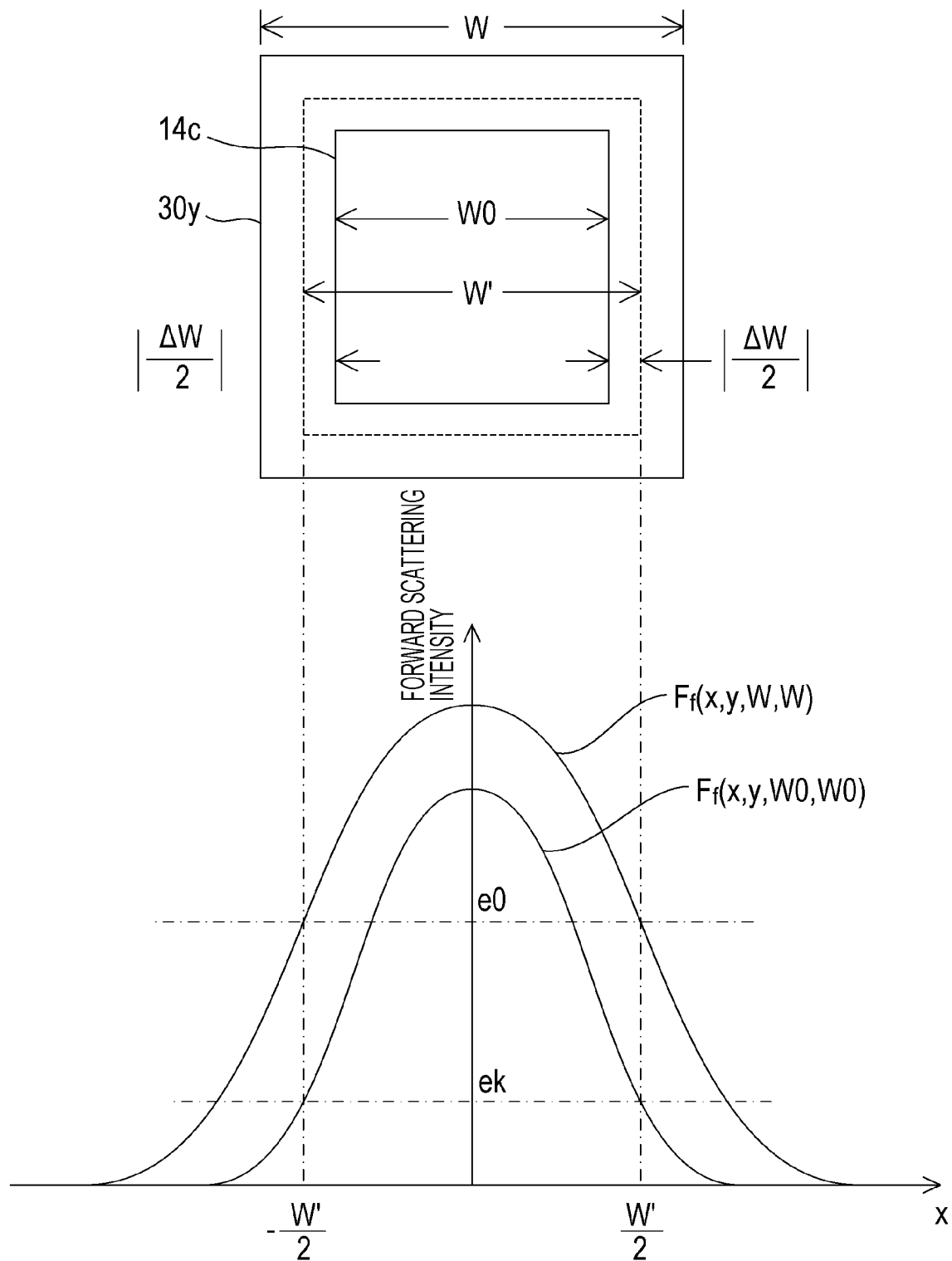
FIG. 12 is a graph of forward scattering intensity for describing the physical significance of Expressions (7) and (8) according to the first embodiment.

FIG. 12 is a graph of forward scattering intensity for describing the physical significance of the Expressions (7) and (8).

The representative mask pattern 14c has a width W0 narrower than the width W of the post-correction device pattern 30y. Accordingly, the range in which energy is accumulated in the resist layer due to the electron beam EB which has passed through the representative mask pattern 14c is narrower than with the post-correction device pattern 30y.

Accordingly, as illustrated in FIG. 12, the forward scattering intensity $F_f(x, y, W0, W0)$ of the representative mask pattern 14c is shifted downwards as compared to the forward scattering intensity $F_f(x, y, W, W)$ of the device pattern 30y.

According to the Expressions (7) and (8), the slice level when the width of each graph is W' is equal to ek with regard to the forward scattering intensity $F_f(x, y, W0, W0)$ of the representative mask pattern 14c and equal to e0 with regard to the forward scattering intensity $F_f(x, y, W, W)$ of the device patterns 30.

Note that the difference ΔW between W0 and W" (obtained by W0−W") is referred to as "process shift".

Setting the width W0 of the representative mask pattern 14c so as to be narrower than the design width W", so that the process shift ΔW assumes a negative value, makes for a steep intensity profile for the electron beam passing through the representative mask pattern 14c at the time of exposure, allowing high contrast to be realized.

In this step, the forward scattering intensity ek is calculated for each representative mask pattern 14c appropriated to the device patterns 30y.

Figure 13:
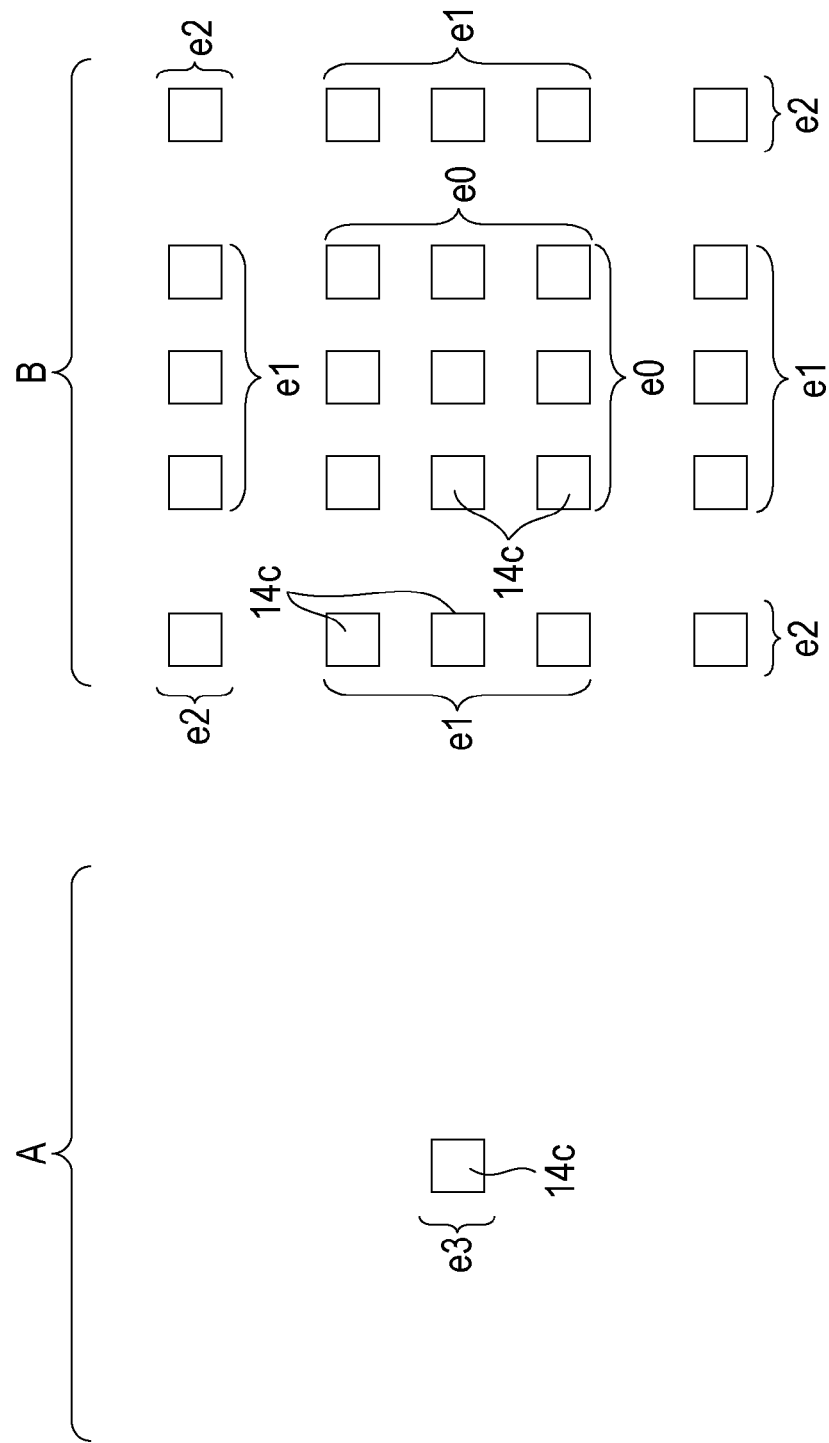
FIG. 13 is a plan diagram schematically illustrating an example of forward scattering intensity calculated according to the first embodiment.

FIG. 13 is a plan view schematically illustrating an example of calculation results thereof.

In the example in FIG. 13, four different forward scattering intensities e0 through e3 are assigned to the representative mask patterns 14c.

Next, in step S5, exposure amounts are appropriated to each of the representative mask pattern 14c as follows.

To perform exposure amount appropriation, first, the back-scattering intensity of the electron beam EB is calculated using the area density method as follows.

Figure 14:
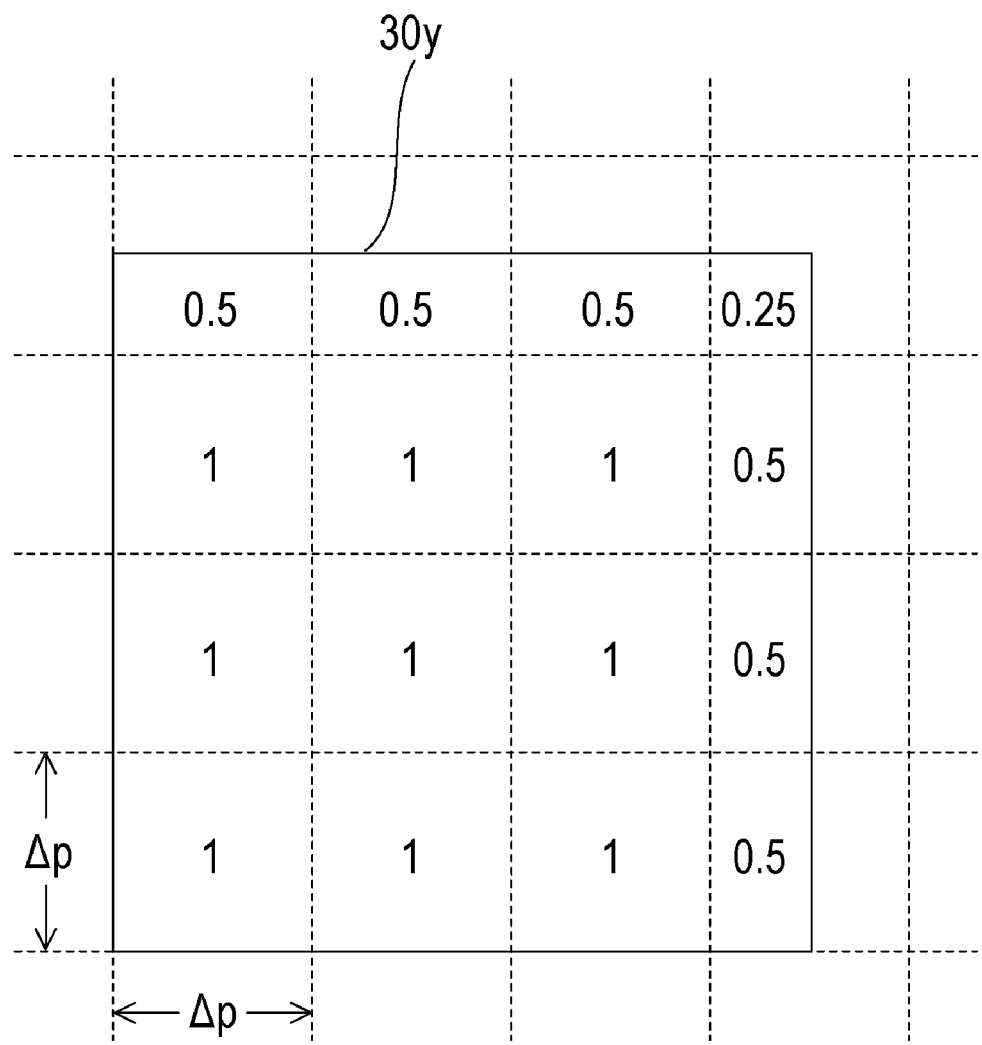
FIG. 14 is an enlarged plan view for describing the area density method according to the first embodiment.

FIG. 14 is a enlarged plan view for describing the area density method.

With the area density method, the post-correction device patterns 30y are divided into a fine mesh form. The grids of the mesh are square in shape, with the length Δp of each side being around 1/10 of the backscattering length $\beta_b$, preferably around 1 μm, for example.

The exposure data creating unit 2 then calculates the ratio which the post-correction device pattern 30y occupies in each mesh. This ratio will be referred to as "area density α". In FIG. 14, the area density α is written in the meshes.

Subsequently, the maximum value $\alpha_{max}$ of the area density α is extracted at one device pattern 30y. In the example illustrated in FIG. 14, the maximum value $\alpha_{max}$ is 1.

Next, the backscattering ratio η is calculated.

Figure 15:
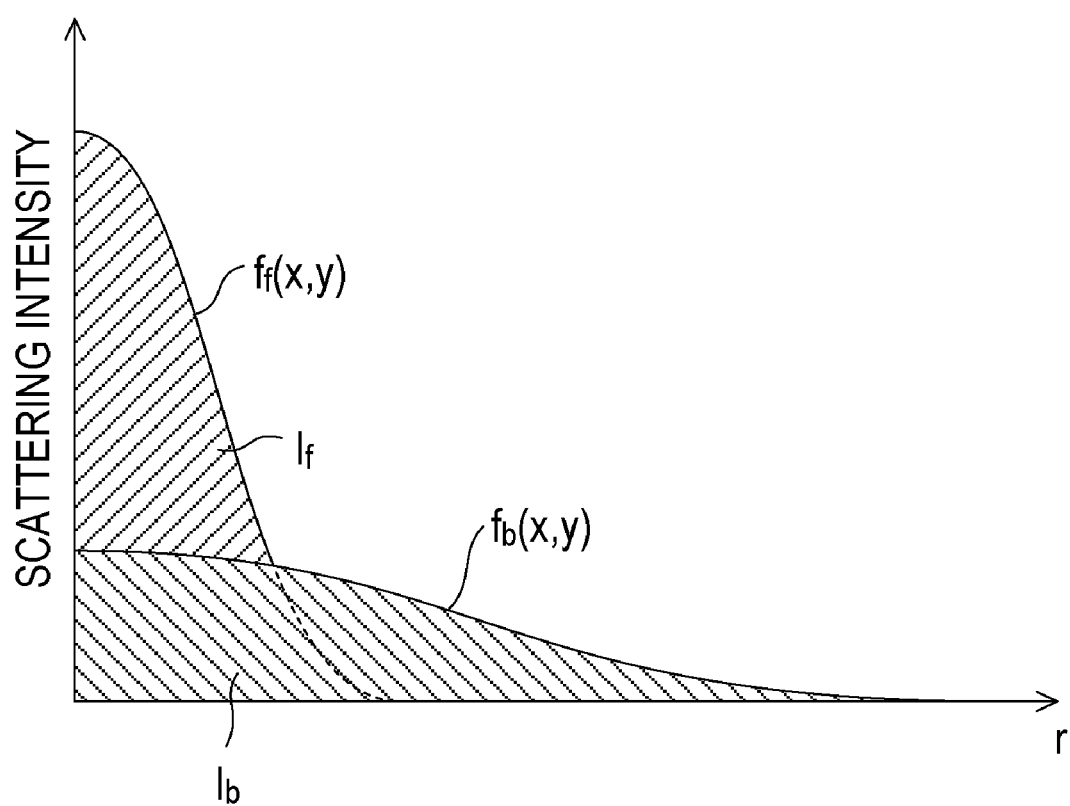
FIG. 15 is a diagram illustrating backscattering ratio η.

FIG. 15 is a diagram illustrating the definition of the backscattering ratio η.

FIG. 15 illustrates the area of a portion between a graph of the backscattering component $f_b(x, y)$ defined in Expression (3) and the horizontal axis as $I_b$. Note that the distance r along the horizontal axis is defined as $r = (x^2 + y^2)^{1/2}$.

Further, FIG. 15 illustrates the area of a portion between a graph of the forward scattering component $f_f(x, y)$ and the graph of the backscattering component $f_b(x, y)$ as $I_f$.

The backscattering ratio η is defined using these areas $I_b$ and $I_f$, with the following Expression (9).

$$\eta = \frac{I_b}{I_f} \quad (9)$$

With the present embodiment, the above $\alpha_{max}$ and $\eta$ are used, such that the backscattering intensity of the electron beam in the post-correction device patterns 30y approximates $\alpha_{max} \cdot \eta$.

Also, with the minimum accumulated energy of the electron beam necessary for resolution of the resist layer as $E_{th}$, the exposure amount dk satisfies the following Expression (10).

$$(ek+\alpha_{max}\cdot\eta)dk=E_{th} \quad (10)$$

From this, the exposure amount dk is as illustrated in the following Expression (11).

$$dk = \frac{E_{th}}{ek + \alpha_{max} \cdot \eta} \quad (11)$$

With the present embodiment, Expression (11) is used for the exposure data creating unit 2 to calculate the exposure amount dk. Also, the k in dk is a suitable integer serving as an additional character to group the same exposure amounts together.

Figure 16:
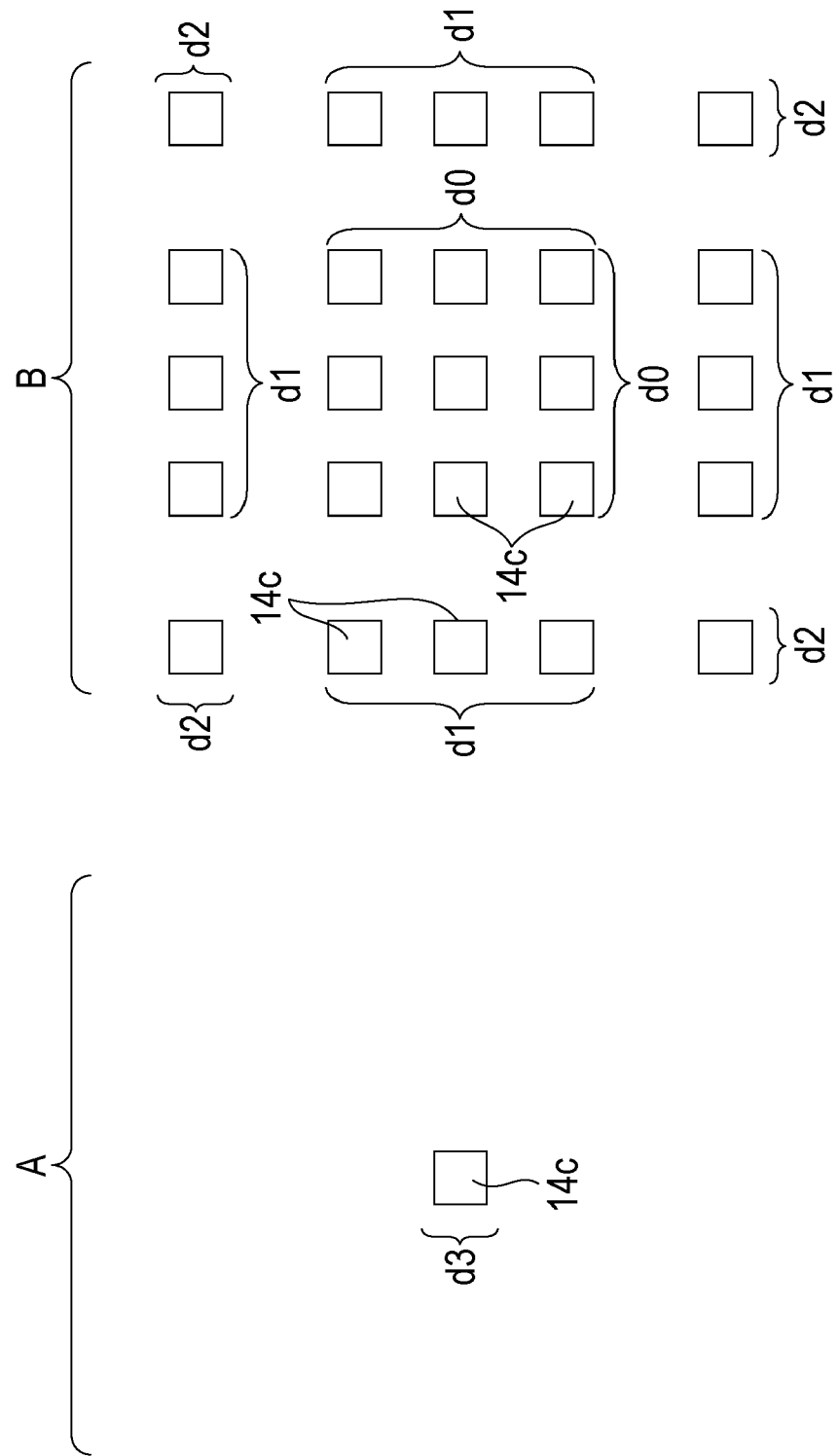
FIG. 16 is a plan diagram schematically representing an example of exposure amount calculated according to the first embodiment.

FIG. 16 is a plan view schematically illustrating an example of the exposure amount dk calculated in this way.

In the example in FIG. 16, four different exposure amounts d0 through d3 are appropriated to the representative mask patterns 14c.

Exposing the device patterns 30 with such exposure amounts dk allows the width of the resist pattern obtained from the exposed resist layer to be made to be the design width W".

Next, the flow advances to step S6, where the exposure data creating unit 2 divides the multiple representative mask patterns 14c into multiple groups by exposure amount.

Figure 17:
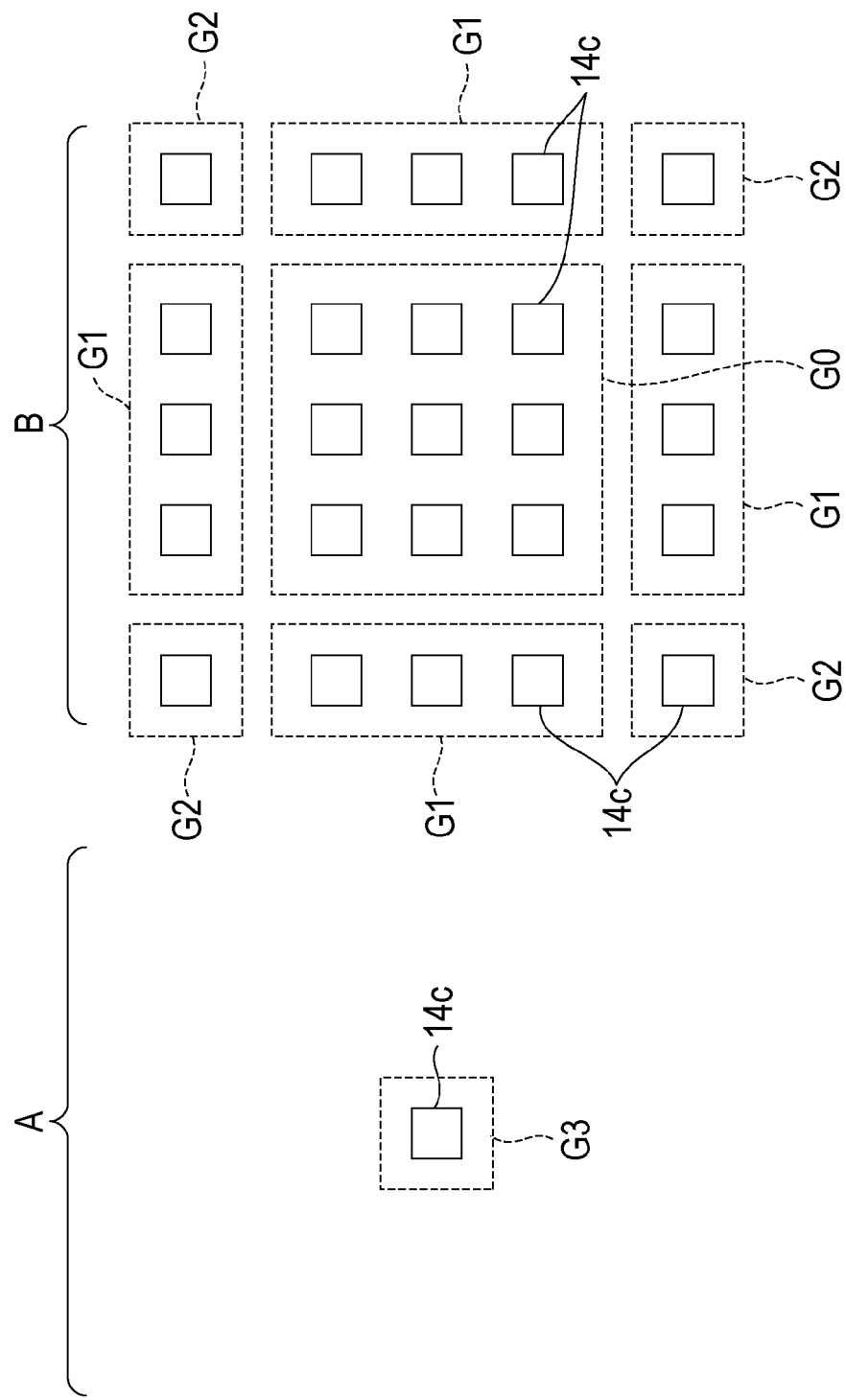
FIG. 17 is a plan view illustrating an example of having grouped multiple representative mask patterns by exposure amount according to the first embodiment.

FIG. 17 is a plan view illustrating a case wherein this grouping has been performed on the example illustrated in FIG. 16.

In this example, the device patterns 30 are grouped into a group G0 of which the exposure amount is d0, a group G1 of which the exposure amount is d1, a group G2 of which the exposure amount is d2, and a group G3 of which the exposure amount is d3.

Next, the flow advances to step S7, where blocks in which are formed mask patterns 14b with the same array as in groups G0 through G3 are selected from the blocks BLK0 through BLK3 (see FIG. 2) for the block mask 14.

Figure 18:
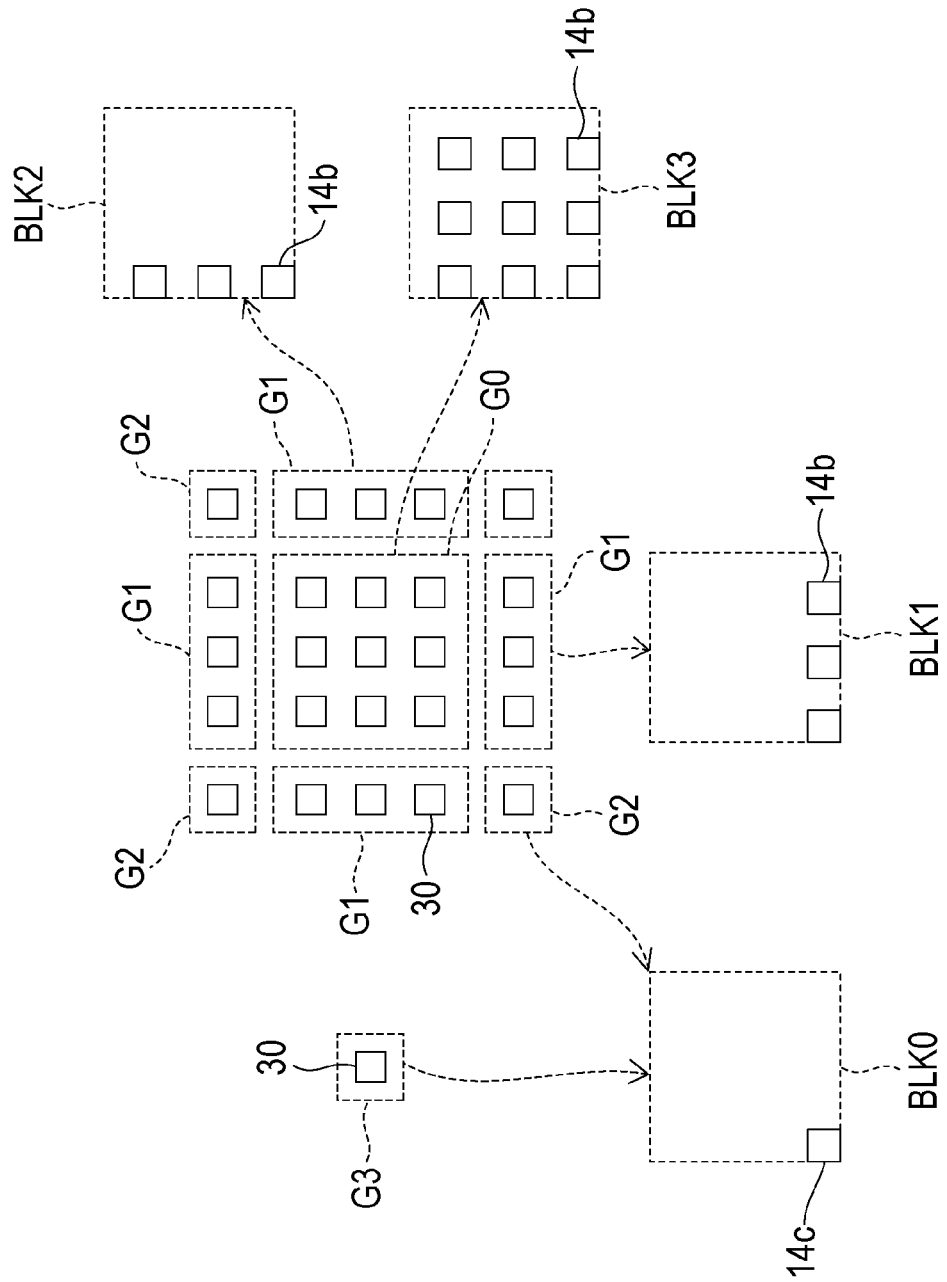
FIG. 18 is a plan view schematically illustrating an example of how to select blocks of mask patterns according to the first embodiment.

FIG. 18 is a plan view schematically illustrating how to perform such selection.

In this example, block BLK3 is selected for group G0, and blocks BLK1 and BLK2 are selected for group G1. Also, block BLK0 is selected for groups G2 and G3.

This completes correction of the exposure data $D_E$.

Next, the flow advances to step S8, where block exposure is performed on the resist layer based on the exposure data $D_E$, using the blocks BLK1 through BLK3 selected in step S7.

According to the present embodiment, the shapes of the device patterns 30 are corrected in step S3, following which representative mask patterns 14c are appropriated in step S4 so that the center of gravity g matches that of the post-correction device patterns 30y.

Figure 19:
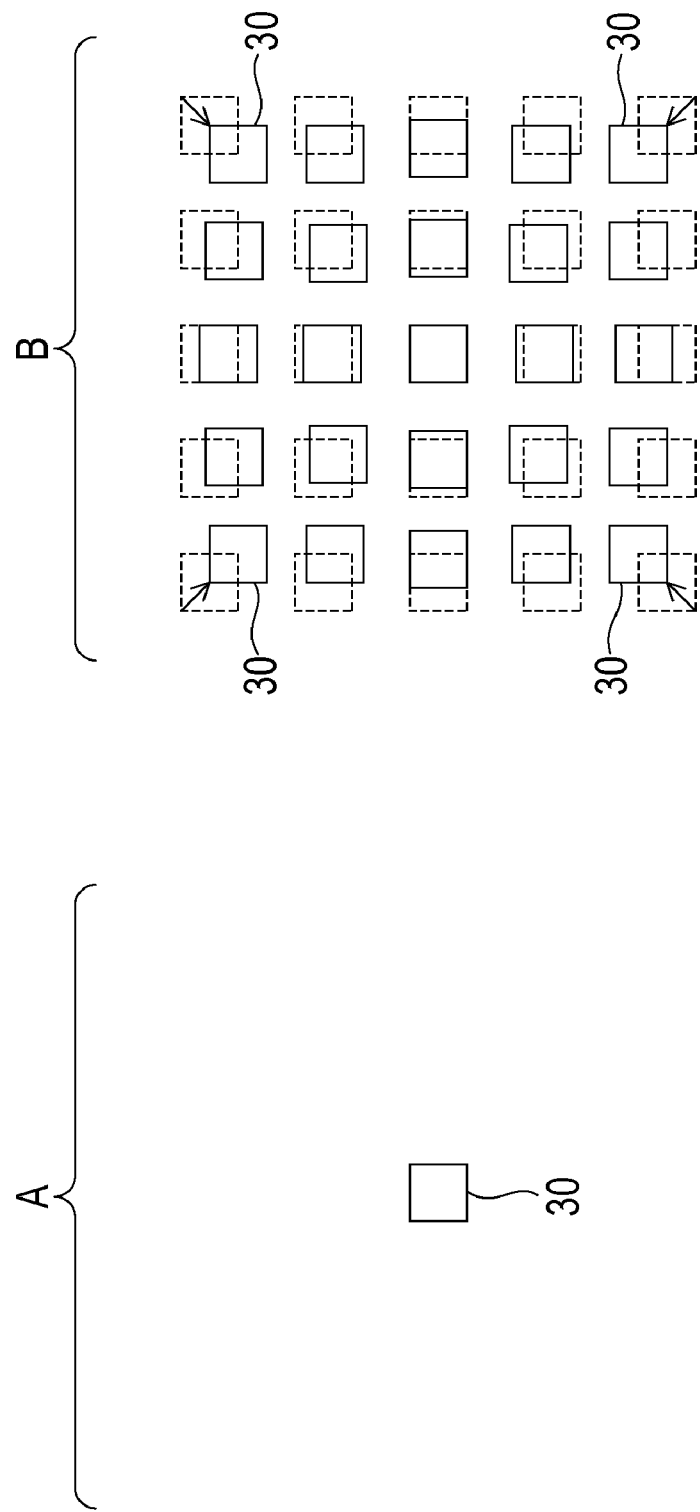
FIG. 19 is a plan view describing problems which occur when omitting steps S3 and S4 according to the first embodiment.

FIG. 19 is a plan view for describing problems which occur in the event that the steps S3 and S4 are omitted, illustrating the placement of device patterns 30 on the resist pattern.

Note that in FIG. 19, the designed device patterns 30 are indicated by dotted lines, and the device patterns 30 actually formed in the resist are indicated by solid lines.

As illustrated in FIG. 19, of the device patterns 30 arrayed in matrix fashion in the high-density region B, the device patterns 30 at the four corners are readily affected by the electron beam from the surroundings as compared to the center device pattern 30. Accordingly, the exposure amount of the device patterns 30 at the four corners has to be higher than the center device pattern 30 in order to obtain the design width. As a result, the device patterns 30 at the four corners shift toward the center, so forming the device patterns 30 at the designed pitch becomes difficult.

Conversely, with the present embodiment, the representative mask patterns 14c are appropriated so that the center of gravity g matches the device patterns 30 which have had their shapes corrected in step S3, so the spacing between the representative mask pattern 14c in the high-density region B may be widened.

Accordingly, increasing the amount of exposure to the representative mask patterns 14c at the four corners to deal with the insufficient exposure due to difference in density of patterns causes the images of the adjacent representative mask patterns 14c to move closer to one another, and device patterns 30 may be formed with the designed spacing. Accordingly, positional shifting and deformation of device patterns 30 due to the proximity effect may be suppressed.

Simulation results of the present embodiment will be described.

With the simulation, the form of the EID function in Expression (1) was assumed as in Expression (12).

$$f(x, y) = \frac{1}{0.0196^2 \pi} \exp\left(-\frac{x^2 + y^2}{0.0196^2}\right) + \frac{1.0516}{0.0668^2 \pi} \exp\left(-\frac{x^2 + y^2}{0.0668^2}\right) + \frac{0.5098}{9.1143^2 \pi} \exp\left(-\frac{x^2 + y^2}{9.1143^2}\right) \quad (12)$$

The target design width W' of the device pattern 30 was set to 60 nm, and the width W0 of the representative mask pattern 14c to 50 nm. Accordingly, the process shift ΔW (W0-W') is −10 nm.

Further, the design value for the spacing between device patterns 30 was set to 60 nm.

Figure 20:
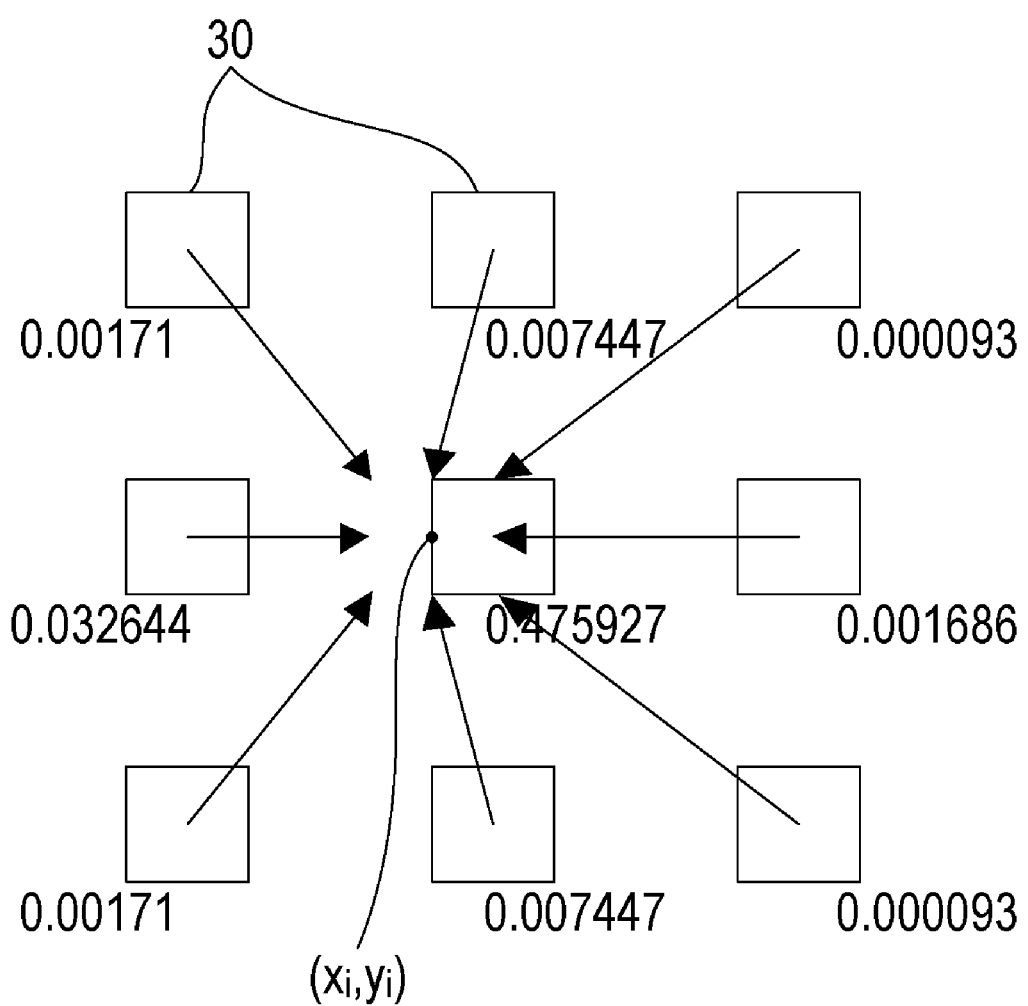
FIG. 20 is a plan view illustrating a simulation of setting a reference value e0 according to the first embodiment.

FIG. 20 is a plan view illustrating a simulation performed when setting the reference value e0.

In FIG. 20, the numbers by the device patterns 30 are the values for the $F_f(x_i, y_i, W, H)$ calculated for the device patterns 30. For this calculation, W and H were both set to 50 nm. Also, $(x_i, y_i)$ represents an evaluation point for the device patterns 30.

With this simulation, the total of the $F_f(x_i, y_i, W, H)$ for the nine device patterns 30 in FIG. 20 were set to e0, with e0=0.528757.

FIG. 21 is a plan view illustrating the placement of the post-correction device patterns 30y obtained by performing steps S1 through S3 under the above-described conditions.

Note that in FIG. 21, the lengths of the sides of the device patterns 30y and spacing between the device patterns 30y are indicated by the numbers, in nm.

Figure 22:
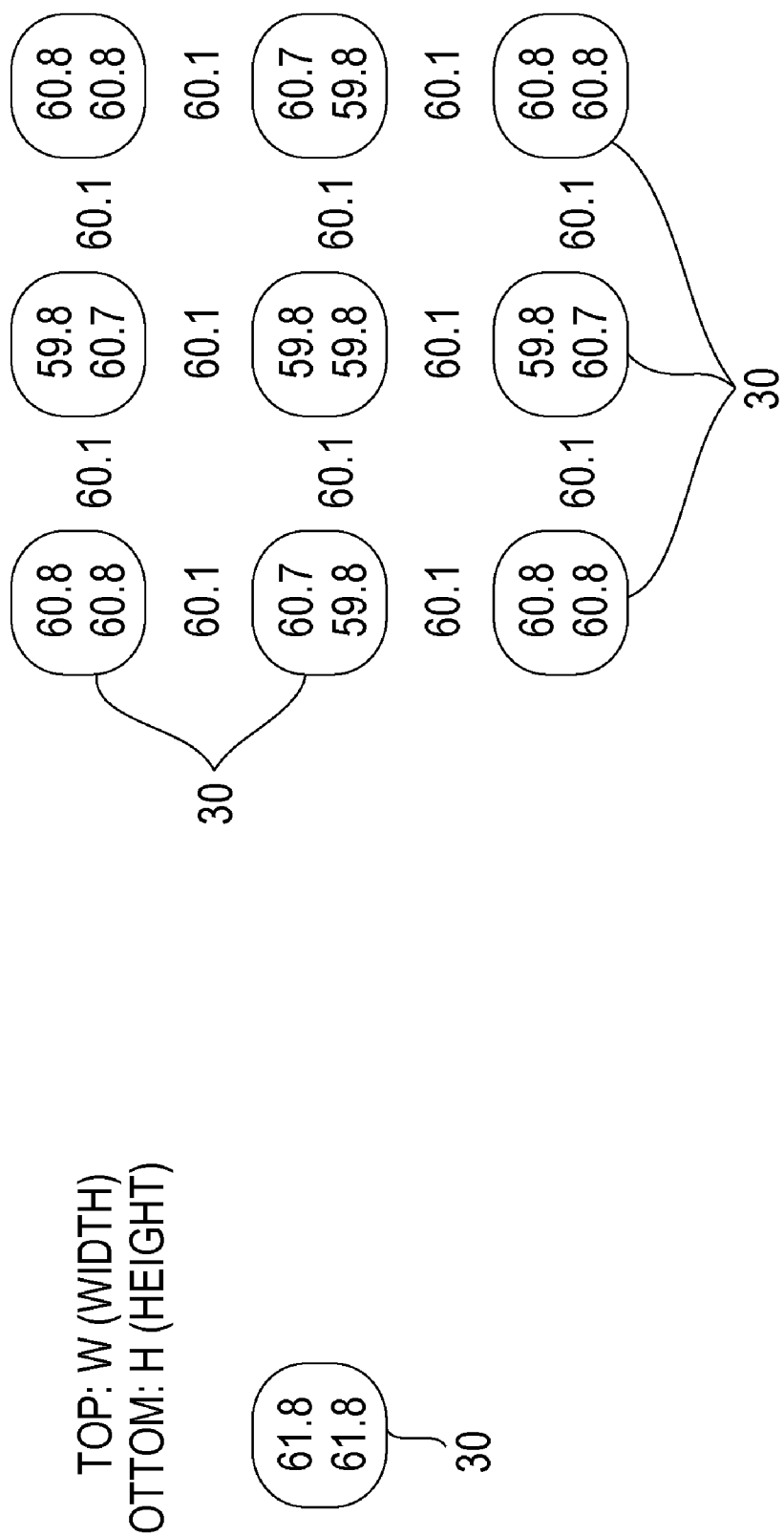
FIG. 22 is a diagram illustrating the results of simulation in a case wherein a mask pattern c is appropriated to the device pattern in FIG. 21, and exposure of the device pattern is performed.

FIG. 22 is a diagram illustrating simulation results for comparison, of a case wherein representative mask patterns 14c are appropriated to the device patterns 30y in FIG. 21 and exposure is performed for the device patterns 30. In this simulation, the exposure amount was set without taking into consideration the backscattering component described with reference to FIGS. 14 and 15, unlike the case of the present embodiment described above. This is because the device patterns 30 used for the simulation were sufficiently small as compared with the range of backscattering, to where the effects of the backscattering were negligible.

In FIG. 22, the numbers between the device patterns 30 indicate the spacing between adjacent device patterns 30. Also, for the numbers within the device patterns 30, the numbers at the top indicate the width W of the device patterns 30, while the numbers at the bottom indicate the height H of the device patterns 30.

As illustrated in FIG. 22, simply correcting the shapes of the device patterns 30 in the high-density region B will result in device patterns 30 having side lengths which differ from those of other device patterns 30 by 1 nm or more.

Figure 23:
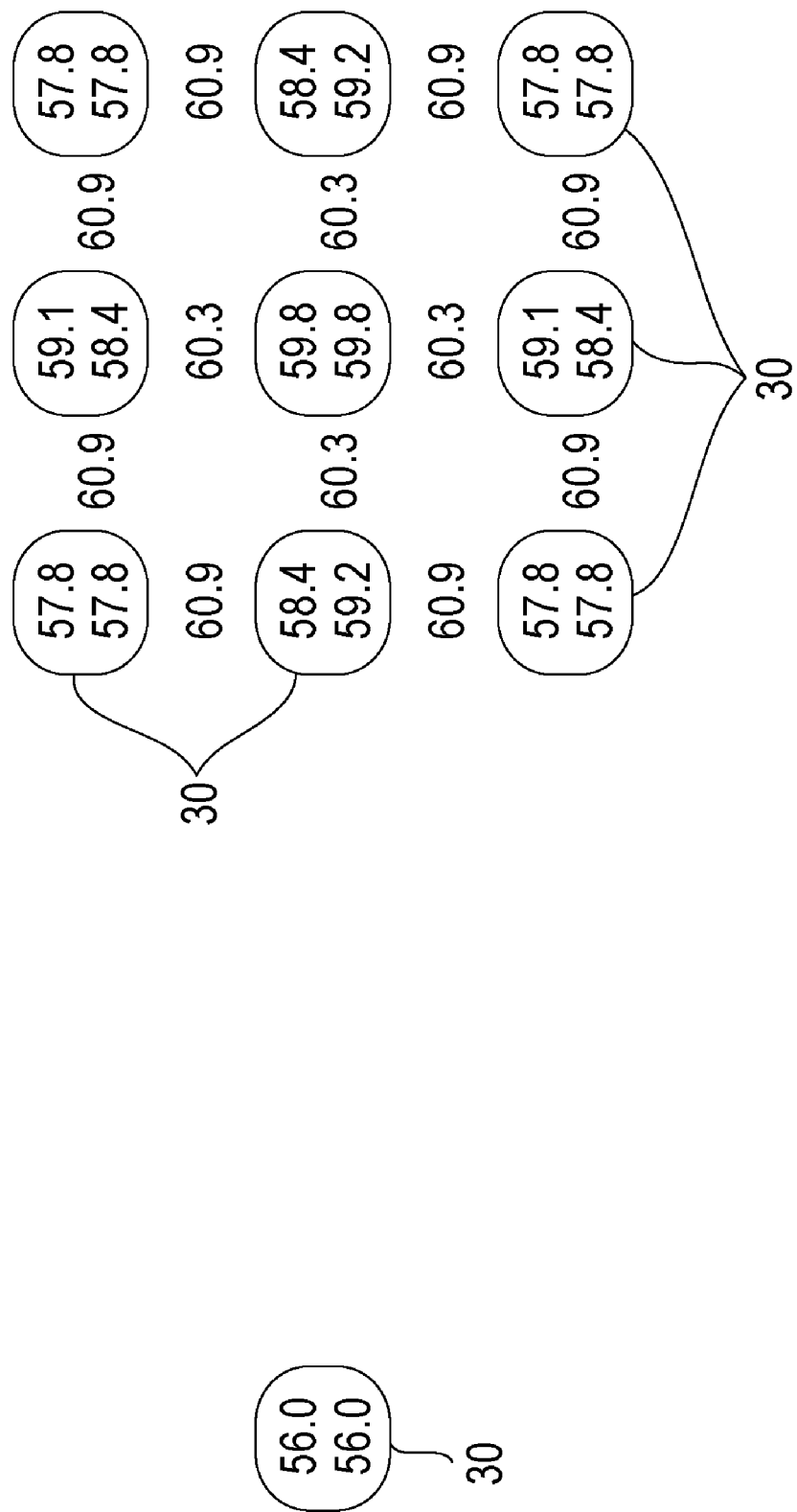
FIG. 23 is a diagram illustrating the results of simulation in a case of not performing shape correction as with FIG. 21 but rather using the exposure data as it is without correction.

Also, FIG. 23 is a diagram illustrating simulation results in a case of using uncorrected exposure data $D_E$ with no shape correction as in FIG. 21. Note that the numbers in FIG. 23 have the same meaning as in FIG. 22.

As illustrated in FIG. 23, without correction of the shapes of the device patterns 30, the lengths of the sides of the device patterns 30 greatly differ from the design width (60 nm). The spacing of the device patterns 30 also deviates from the design value (60 nm).

Figure 24:
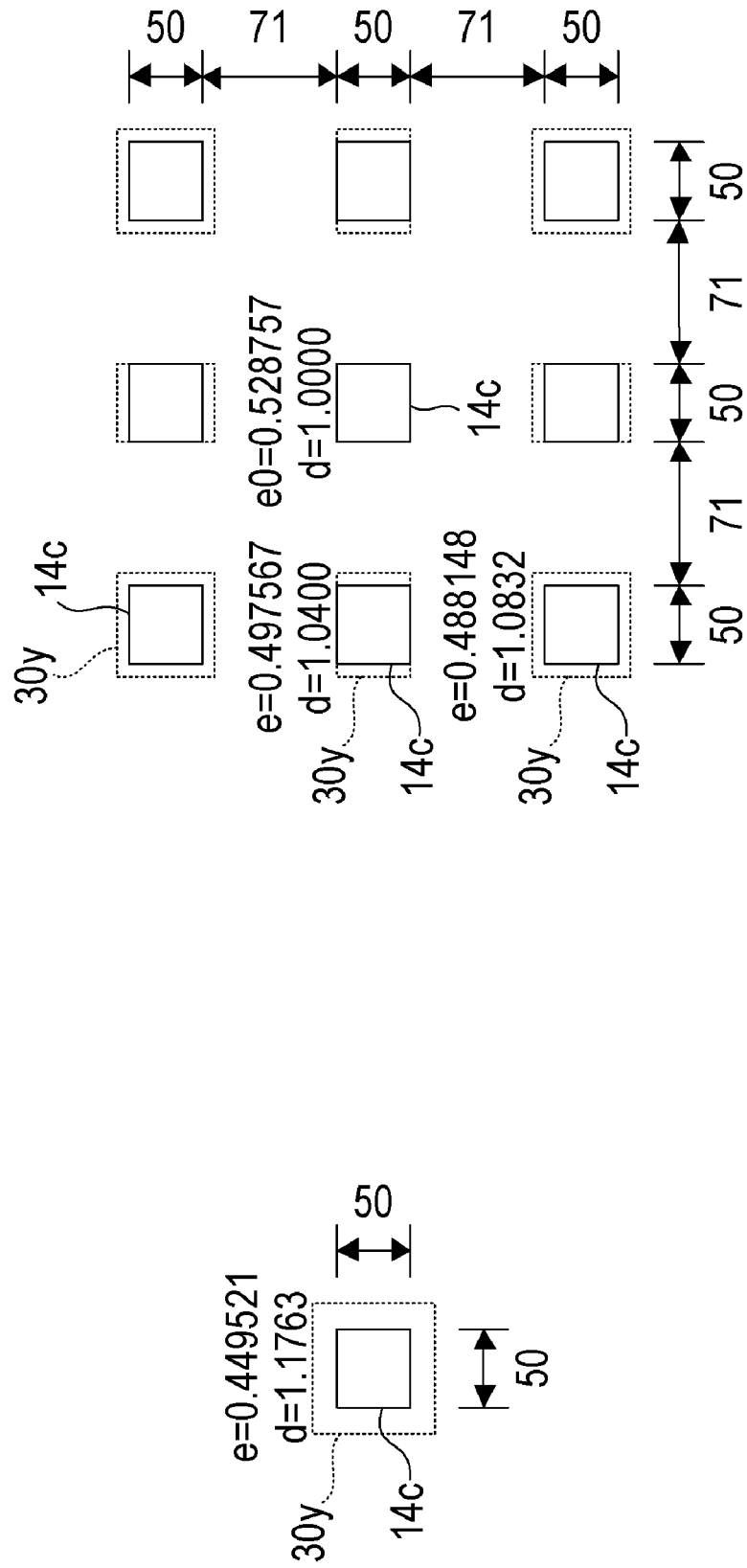
FIG. 24 is a plan view illustrating appropriating representative patterns to each device pattern following the correction illustrated in FIG. 21 following step S4 according to the first embodiment.

FIG. 24 is a plan view illustrating representative mask patterns 14c to the post-correction device patterns 30y illustrated in FIG. 21 following step S4.

Note that in FIG. 24, the forward scattering intensity e calculated in step S4 and the exposure amount d calculated in step S5 are also written in addition to the spacing between the representative mask patterns 14c.

Figure 25:
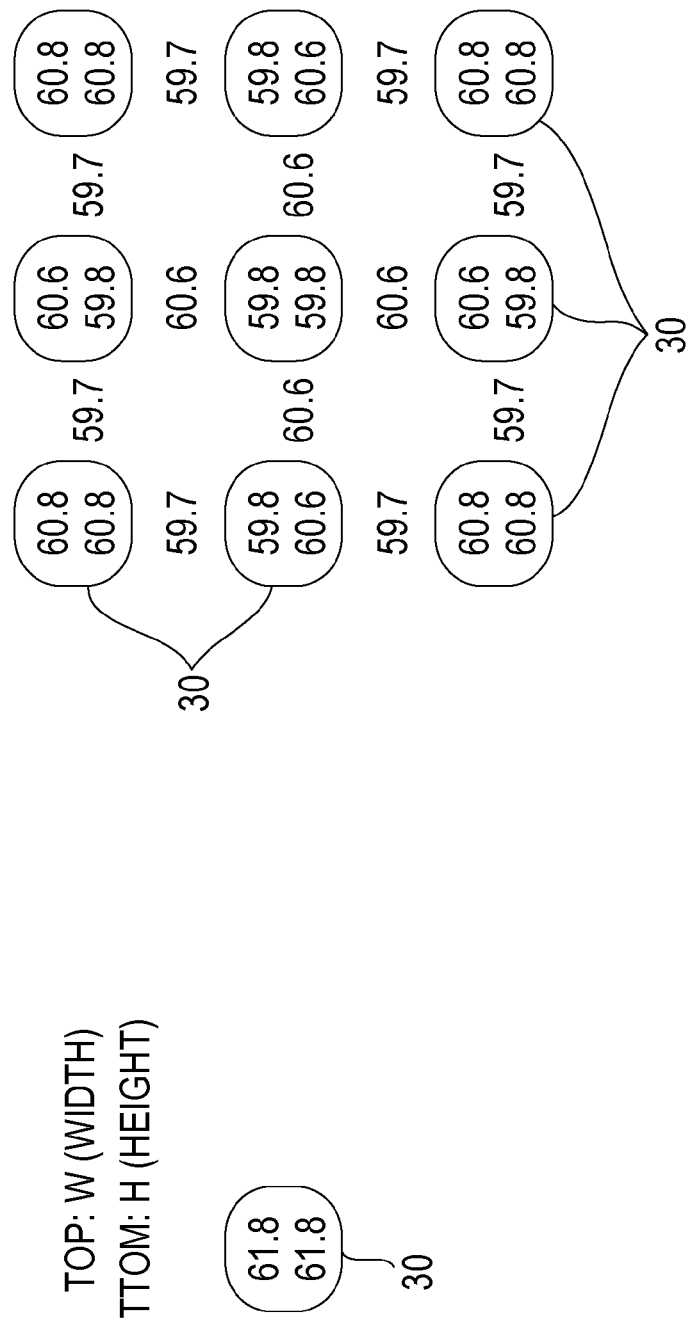
FIG. 25 is a diagram illustrating simulation results in a case of performing exposure according to the first embodiment.

FIG. 25 is a diagram illustrating simulation results in a case of appropriating representative mask pattern 14c in this way and exposing with the exposure amount d.

Note that the numbers in FIG. 25 have the same meaning as in FIGS. 22 and 23.

As illustrated in FIG. 25, performing steps S1 through S5 enables the length of the sides of the device patterns 30 to be made closer to the design width (60 nm) as compared with those in FIGS. 22 and 23 described above, and also the spacing between the device patterns 30 to be closer to the design value (60 nm).

Accordingly, it was confirmed that correcting the exposure data $D_E$ according to the present embodiment is advantageous in obtaining device patterns 30 of an array close to that of the design layout.

Second Embodiment

With the above-described first embodiment, multiple representative mask pattern 14c are grouped into groups G0 through G3 by exposure amount in step S6, with block exposure being performed individually on the groups G0 through G3.

Conversely, with the present embodiment, block exposure is performed as follows, without such grouping.

Figure 26:
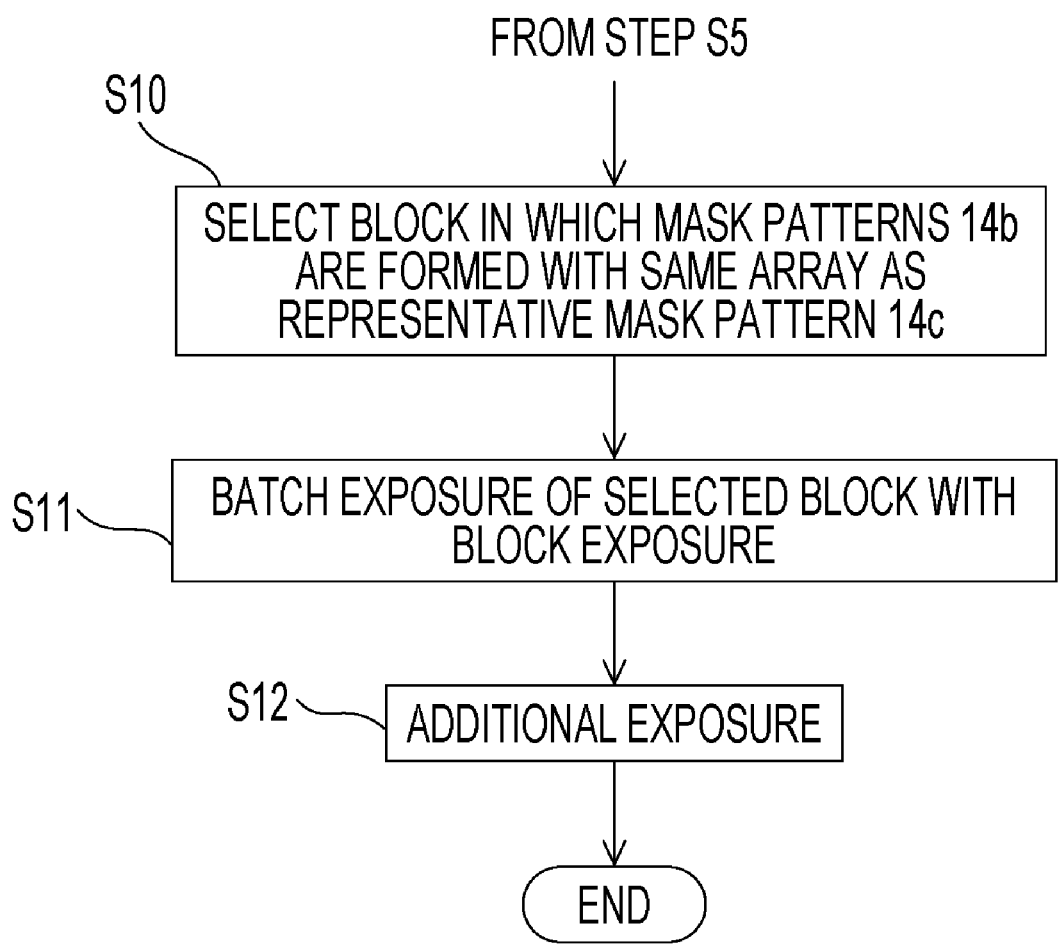
FIG. 26 is a flowchart of a charged particle beam exposure method according to a second embodiment.

FIG. 26 is a flowchart illustrating the charged particle beam exposure method according to the present embodiment.

With the present embodiment, after having performed steps S1 through S5 according to the first embodiment, the flow advances to step S10.

Figure 27:
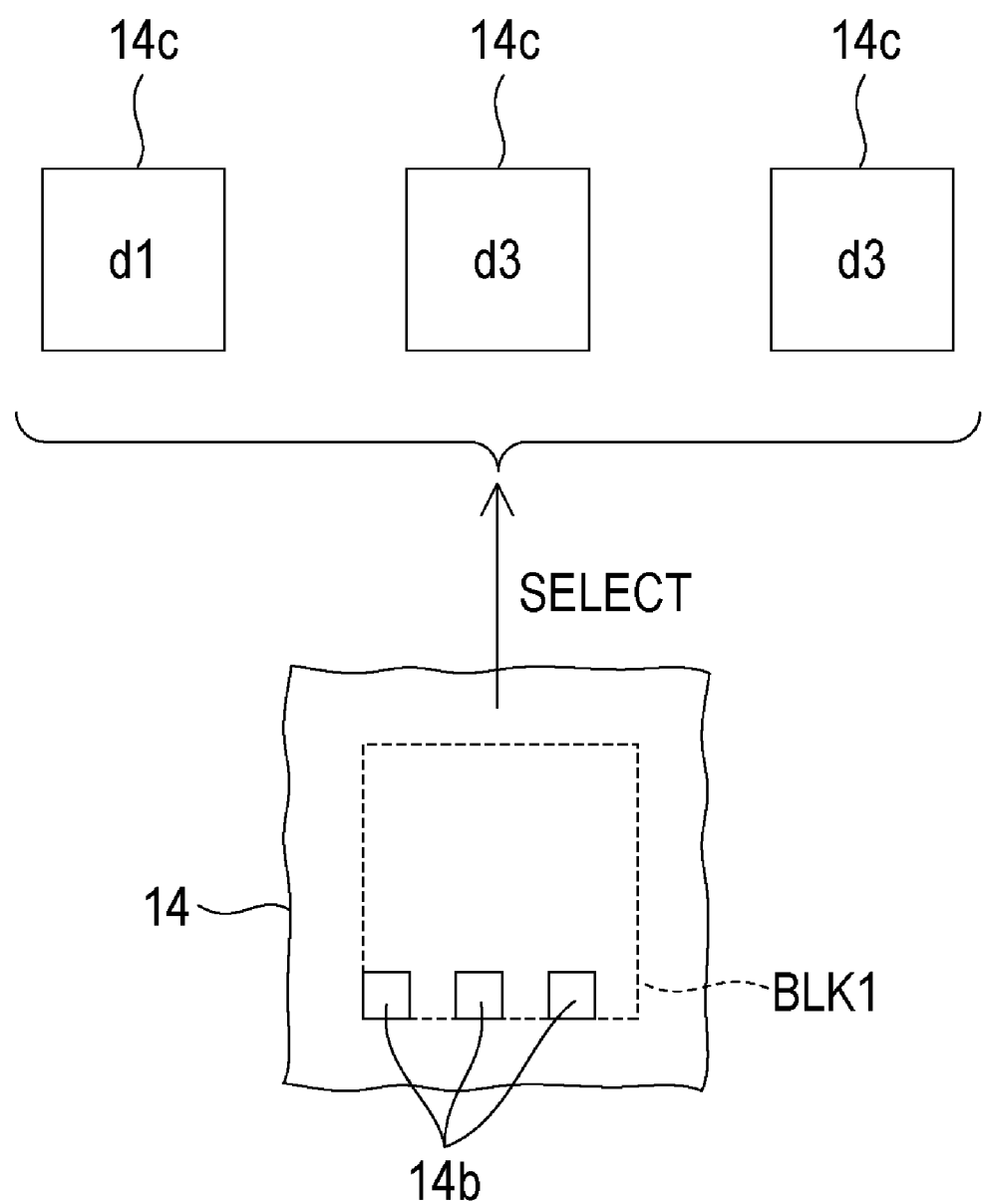
FIG. 27 is a plan view for schematically describing the processing in step S10 according to the second embodiment.

FIG. 27 is a plan view for schematically describing the processing in step S10.

FIG. 27 illustrates a state in which exposure amounts d1 through d3 have been appropriated to the representative mask patterns 14c due to step S5 according to the first embodiment having been performed.

In step S10, the block BLK1 of which the array of mask patterns 14b is the same as the representative mask patterns 14c described above is selected from the blocks BLK0 through BLK3 of the block mask 14.

At this time, the exposure amounts d1 through d3 as to the representative mask patterns 14c are not necessarily the same. Accordingly, the exposure amounts d1 through d3 of the individual representative mask patterns 14c are stored in the storage unit 2a of the exposure data creating unit 2 (see FIG. 1) beforehand.

Next, the flow advances to step S11, where batch exposure of the resist layer is performed with the electron beam by block exposure, using the block BLK1.

The smallest value of d1 through d3 is used for the exposure amount d at this time. For example, in the event that there is the relation of d3>d2>d1 in magnitude, the exposure amount d1 which is the smallest value is used to perform block exposure.

Figure 28:
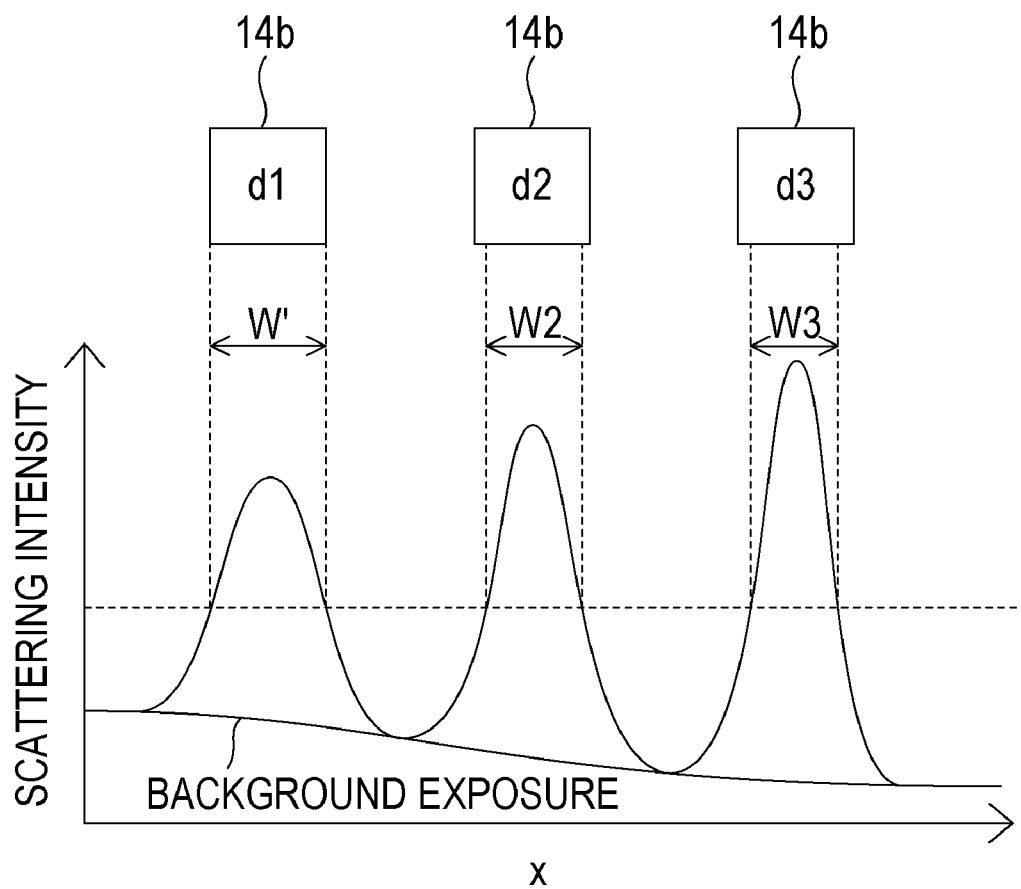
FIG. 28 is a graph schematically illustrating the relation between the scattering intensity of the electron beam in a case of block exposure according to the second embodiment, and the position within the resist layer.

FIG. 28 is a graph schematically illustrating the relation between the scattering intensity of the electron beam in such block exposure, and a position x within the resist layer.

Performing exposure with the exposure amount d described above (i.e., d1) results in the width resolved at the resist to be the design width W' for the mask patterns 14b of which the exposure amount d is the appropriate exposure amount.

Conversely, the device patterns 30 of which the appropriate exposure amount is d2 and d3 will be underexposed, so the widths W2 and W3 resolved at the resist will be narrow than the design width W'.

In order to compensate for such underexposure, additional exposure is performed in the next step S12.

Figure 29:
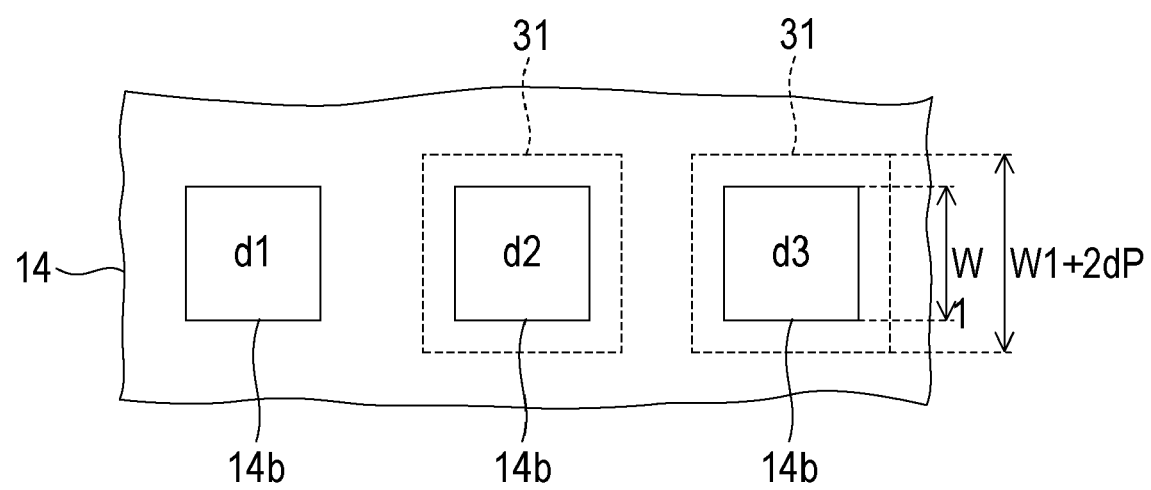
FIG. 29 is a plan diagram schematically illustrating additional exposure according to the second embodiment.

FIG. 29 is a plan view schematically illustrating the additional exposure.

As illustrated in FIG. 29, additional exposure patterns 31 are shaped larger than the mask patterns 14b, and are cast onto the block mask 14 in that state.

The additional exposure patterns 31 are obtained by shaping the cross-sectional shape of the electron beam EB so as to be greater than the mask patterns 14b, using the variable-shaped rectangular exposure described with reference to FIG. 3.

When it is taken that the maximum positional shifting that occurs at the exposure device 1 is dP and the width of the mask patterns 14b is W1, the size of the additional exposure pattern 31 is preferably W1+2dP. Setting the size of the additional exposure patterns 31 taking the positional shift dP into consideration enables prevention of a part of the electron beam passing through the mask patterns 14b from being missing due to positional shifting of the patterns 31 and 14b.

On the other hand, the additional exposure amount Δd is set so that the total exposure amount with the block exposure amount is an appropriate exposure amount.

For example, for a mask pattern 14b of which the appropriate exposure amount is d2, the additional exposure amount Δd is set to d2−d. Also, for a mask pattern 14b of which the appropriate exposure amount is d3, the additional exposure amount Δd is set to d3−d.

Figure 30:
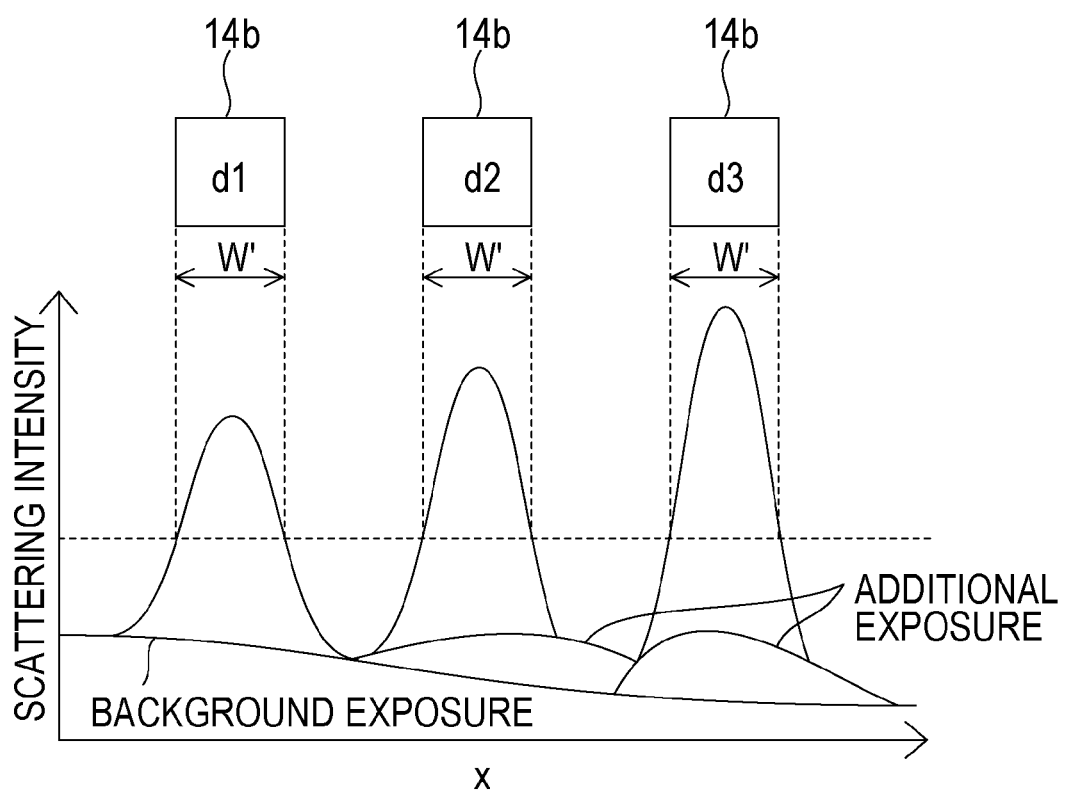
FIG. 30 is a graph schematically illustrating the relation between the scattering intensity of the electron beam in a case of performing additional exposure according to the second embodiment, and the position within the resist layer.

FIG. 30 is a graph schematically illustrating the relation between the scattering intensity of the electron beam in a case of performing such additional exposure, and a position x within the resist layer.

As illustrated in FIG. 30, performing additional exposure shifts upwards the forward scattering intensity of the electron beam which has passed through the mask patterns 14b. Thus, the width of the resist pattern obtained from the resist layer exposed with the mask patterns 14b may be made equal to the design width W'.

This completes the basic steps of the electron beam exposure method according to the present embodiment.

As described above, with the present embodiment, multiple mask patterns 14b are exposed in batch fashion by block exposure, and additional exposure is performed for underexposed mask patterns 14b. The amount of exposure is small for the additional exposure, so the total electron beam irradiation time is shorter as compared with a case of individually exposing the mask patterns. This enables the width resolved in the resist layer to be closer to the design width while maintaining the advantage of block exposure which is the high throughput.

Third Embodiment

With the first embodiment, description has been made with an assumption that the sizes of the representative mask patterns 14c belonging to the representative block BLK0 are the same, and the shapes are the same square shape, i.e., that there is just one type of representative mask pattern 14c, as illustrated in FIG. 2.

However, the representative mask patterns 14c making up the block mask 14 are not restricted to one type in this way, and may be multiple types of different shapes and sizes.

Figure 31:
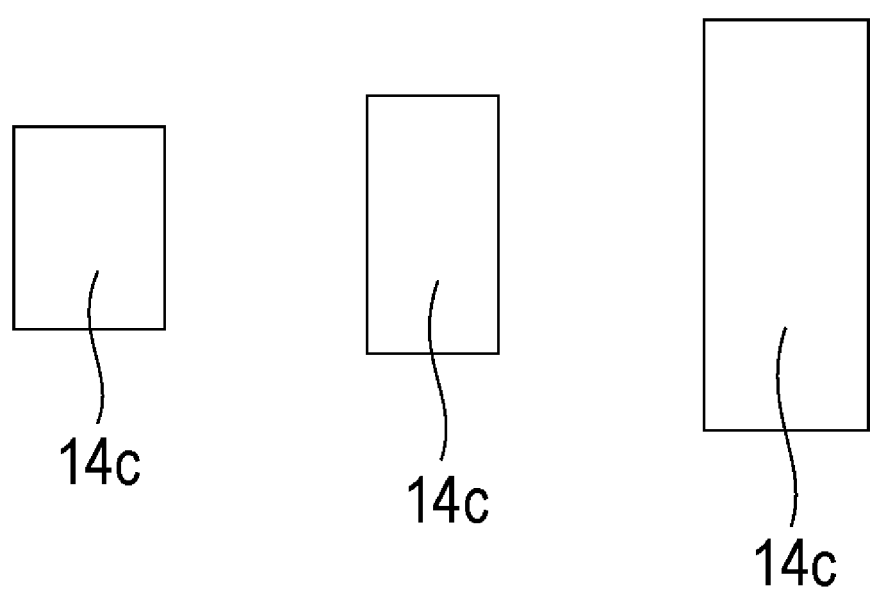
FIG. 31 is a plan view illustrating an example of multiple types of representative patterns used according to a third embodiment.

FIG. 31 is a plan view illustrating an example of representative mask patterns 14c of such multiple types.

The way to perform the processing in step S4 according to the first embodiment in the event that there are such multiple types of different shapes and sizes of representative mask patterns 14c as illustrated in FIG. 31 will be described next.

As described with the first embodiment, step S4 is a step for appropriating representative mask patterns 14c to post-correction device patterns 30y of which the shapes have been corrected. The processing method differs depending on whether the representative mask pattern 14c and the device patterns 30y of which the shapes have been corrected are similar, so description will be made separately for either case.

Figure 32A:
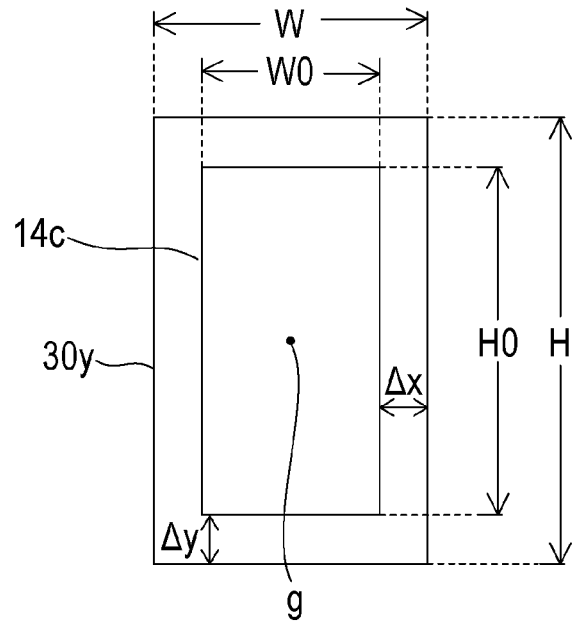
FIGS. 32A and 32B are plan views illustrating a method for appropriating a representative mask pattern to a device pattern according to the third embodiment.

(i) Case where there is a representative mask pattern 14c similar with post-correction device pattern 30y In this case, the representative mask pattern 14c which has the smallest shape difference with the device pattern 30y is selected from the multiple representative mask patterns 14c, as illustrated in FIG. 32A.

Shape difference is defined by the offset amount Δx of the long side with the center of gravity g of the device pattern 30y and representative mask pattern 14c matched. Shape difference may be defined by the offset amount Δy of the short side instead.

The device pattern 30y is appropriated with a representative mask pattern 14c so that the centers of gravity g match.

The reference value e0 of the forward scattering intensity is calculated from the following Expression (13) in which the fourth variable to the right side in Expression (7) has been changed to H.

$$e0 = F_f(W'/2, 0, W, H) \quad (13)$$

Note that the variables W and H are the width and height of the post-correction device pattern 30y.

Also, the forward scattering intensity ek is calculated from the following Expression (14) in which the fourth variable to the right side in Expression (8) has been changed to H0.

$$e = F_f(W'/2, 0, W0, H0) \quad (14)$$

Note that the variables W0 and H0 are the width and height of the representative mask pattern 14c.

Step S4 in the first embodiment is performed using the e and e0 calculated in this way.

Figure 32B:
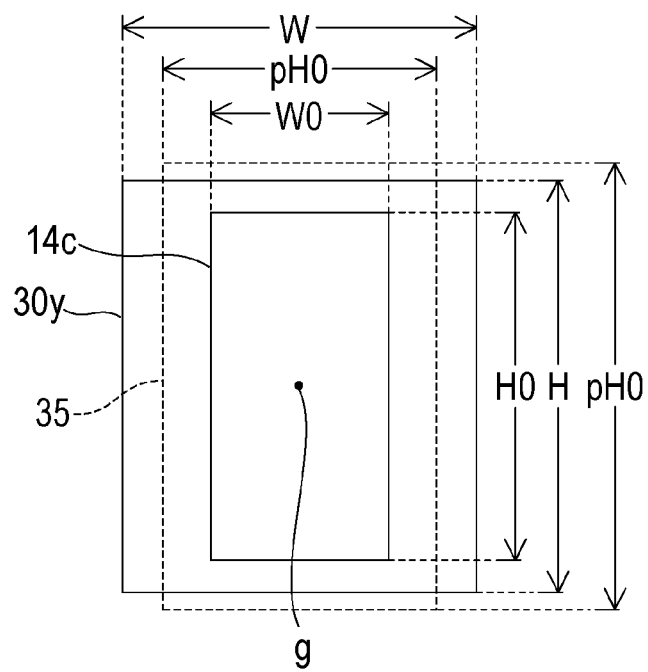

(ii) Case where there is no representative mask pattern 14c similar with post-correction device pattern 30y FIG. 32B illustrates a plan view of this case.

In this case, further case differentiation is made depending on whether or not the ratio H/W of the width W and height H of the post-correction device pattern 30y is within a reference ratio R. Note that while the reference ratio R is not restricted in particular, in the following R=2 is assumer for reference.

(a) Case where H/W≦R

In this case, a hypothetical rectangle 35 with the same area as the device pattern 30y is conceived, and a representative mask pattern 14c is selected which has the smallest shape difference as to the hypothetical rectangle 35 and is the closest to being similar with the hypothetical rectangle 35, as illustrated in FIG. 32B. The representative mask pattern 14c is appropriated to the device pattern 30y so that the centers of gravity g match.

The following expression holds for the areas of the device pattern 30 and the hypothetical rectangle 35 to be the same as described above.

$$pW0 \times pH0 = W \times H \quad (15)$$

Here, W0 and H0 are the width and height of the representative mask pattern 14c, and pW0 and pH0 are the width and height of the hypothetical rectangle 35.

From Expression (15), the ratio of similarity between the representative mask pattern 14c and hypothetical rectangle 35 may be written as in Expression (16).

$$p = \sqrt{\frac{W \times H}{W0 \times H0}} \quad (16)$$

This ratio of similarity is used to calculate the forward scattering intensity e and the reference value e0 thereof from the following Expressions (17) and (18).

$$e = F_f(W'/2, 0, W0, H0) \quad (17)$$

$$e0 = F_f(W'/2, 0, pW0, pH0) \quad (18)$$

As seen from Expression (18), with the present example, the reference value e0 of the forward scattering intensity is calculated using the width pW0 and height pH0 of the hypothetical rectangle 35. This is because using the width pW0 and height pH0 of the hypothetical rectangle which is similar to the representative mask pattern 14c to actually be exposed yields higher precision than a case of using the width W and height H of the device pattern 30y.

(b) Case where H/W>R

In this case, the hypothetical rectangle 35 such as described is not used, and the forward scattering intensity e and the reference value e0 thereof are calculated using the Expressions (13) and (14) already described above. This is because in the event that the H/W is great, the forward scattering component $f_f(x, y, W, H)$ defined in Expression (6) is not dependent on H, so there is no advantage in calculating the reference value e0 using the width pW0 and height pH0 of the hypothetical rectangle 35 as in Expression (18).

Fourth Embodiment

While the first through third embodiments have been described with regard to an example wherein the device patterns 30 are hole shapes, the exposure method described with these embodiments is also applicable to device patterns with long shapes.

Figure 33A:
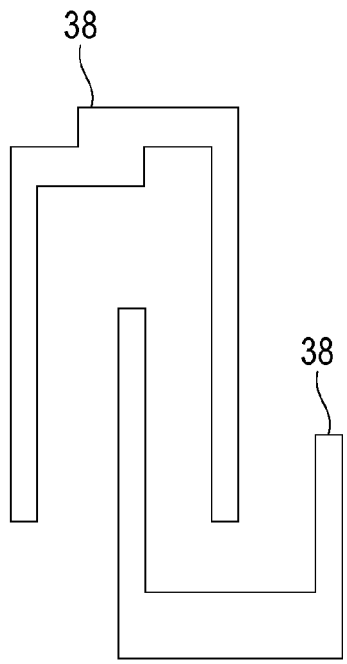
FIGS. 33A and 33B are plan views illustrating an exposure method for obtaining an elongated device pattern.

FIG. 33A is a plan view illustrating the state of such long device patterns 38 having been subjected to the processing of steps S1 through S3 according to the first embodiment, so as to correct the shape of the device patterns 38.

Figure 33B:
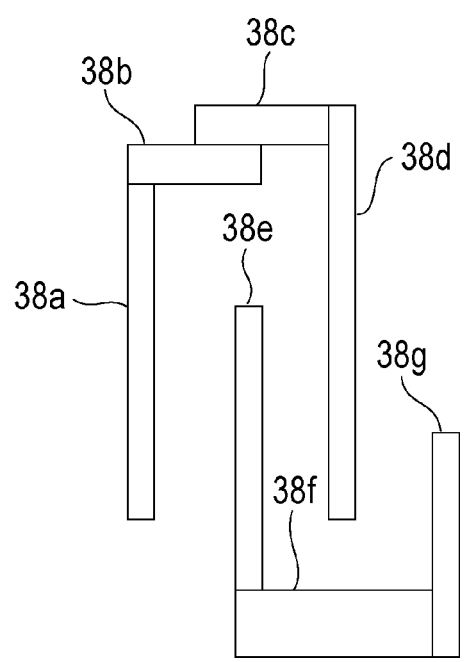

To expose device patterns with such shapes, the device patterns 38 are divided into multiple rectangular patterns 38a through 38g, as illustrated in FIG. 33B.

An exposure mask having mask patterns of shapes corresponding to these rectangular patterns 38a through 38g is then used to expose the patterns 38a through 38g individually, thereby enabling device patterns 38 with long shapes such as illustrated in FIG. 33A to be realized.

Fifth Embodiment

With the present embodiment, a semiconductor device manufacturing method using the exposure method described with the first through fourth embodiments, will be described.

Figure 34A:
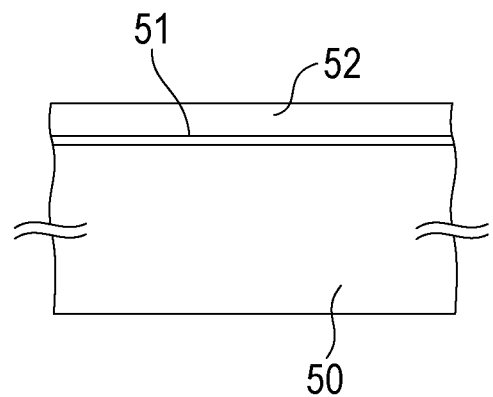
FIGS. 34A through 34N are cross-sectional diagrams illustrating the manufacturing process of a semiconductor device according to a fifth embodiment.
Figure 34B:
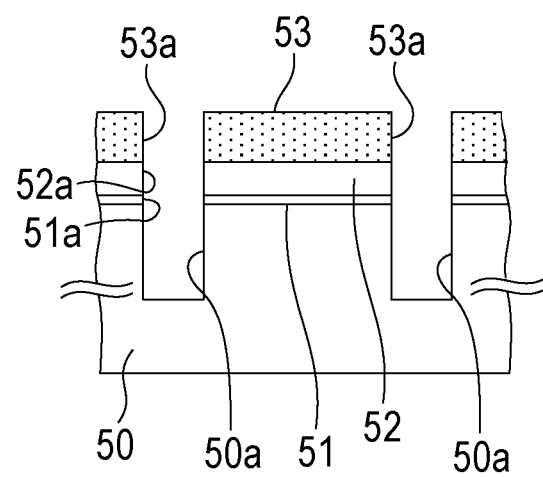
Figure 34C:
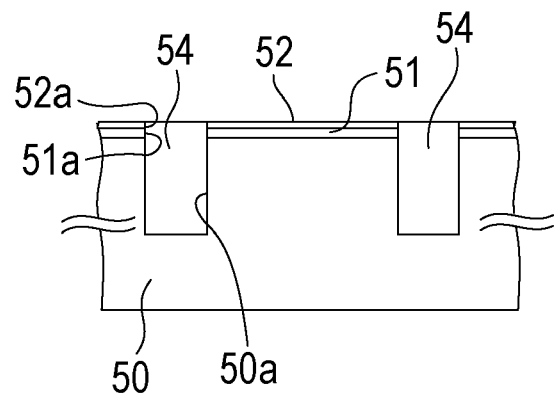
Figure 34D:
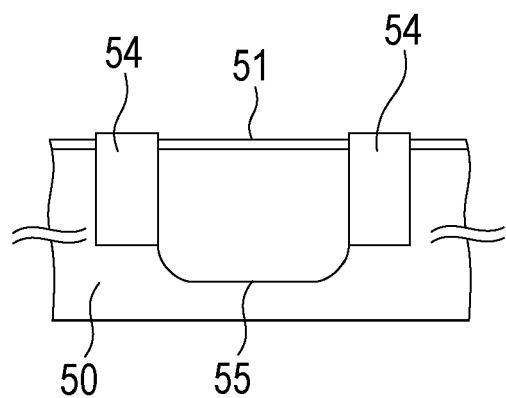
Figure 34E:
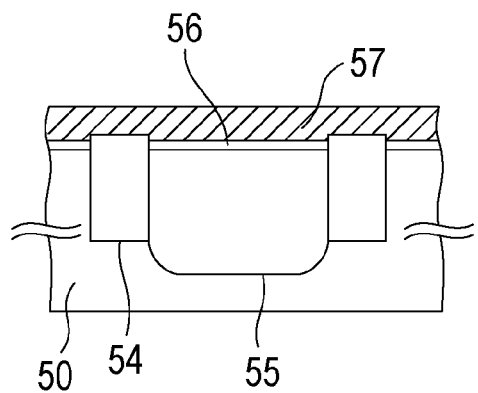
Figure 34F:
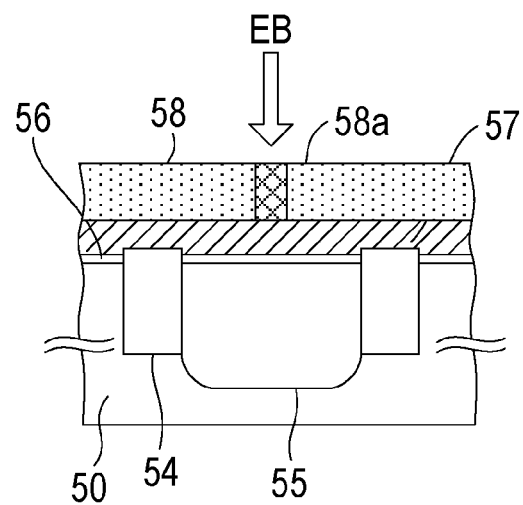
Figure 34G:
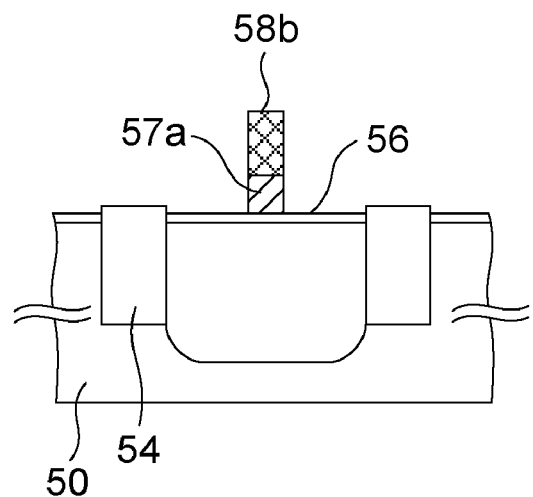
Figure 34H:
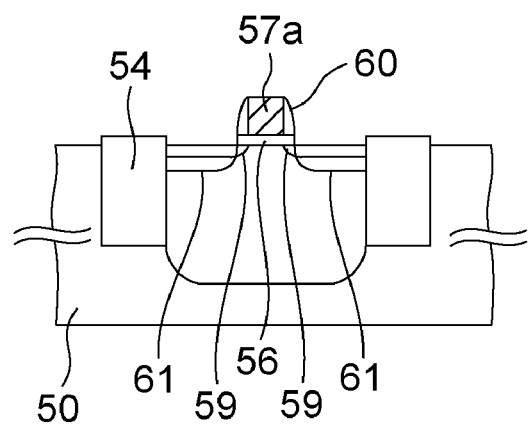
Figure 34I:
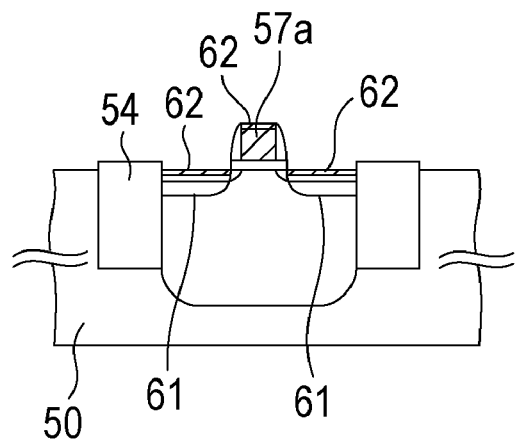
Figure 34J:
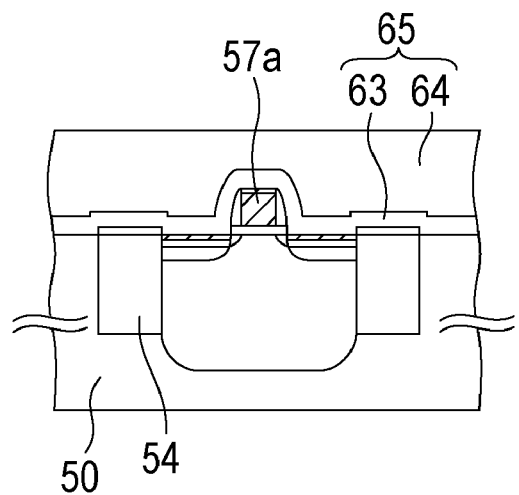
Figure 34K:
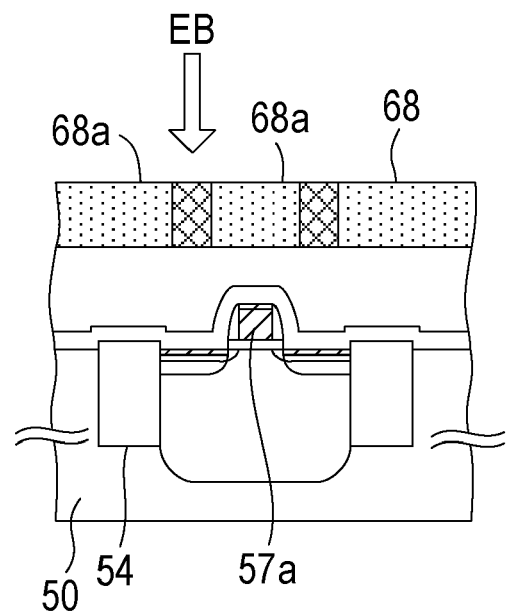
Figure 34L:
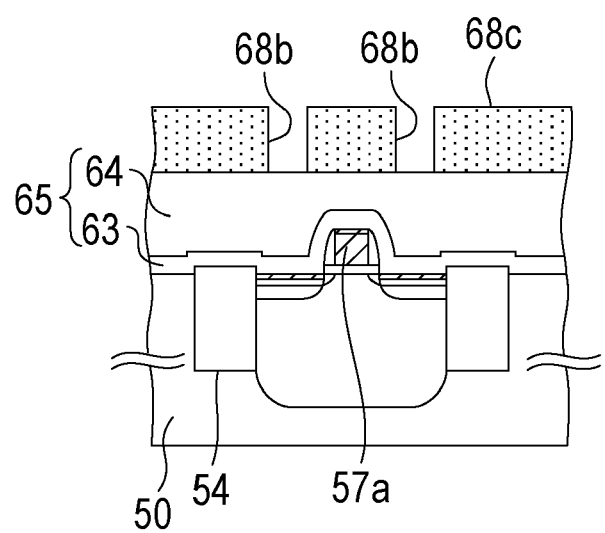
Figure 34M:
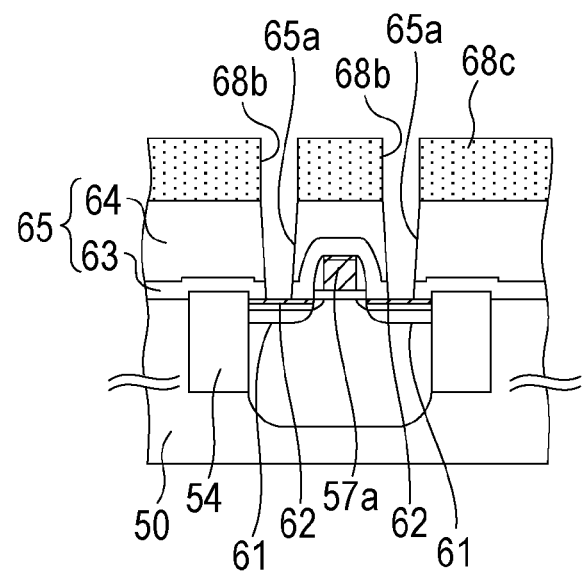
Figure 34N:
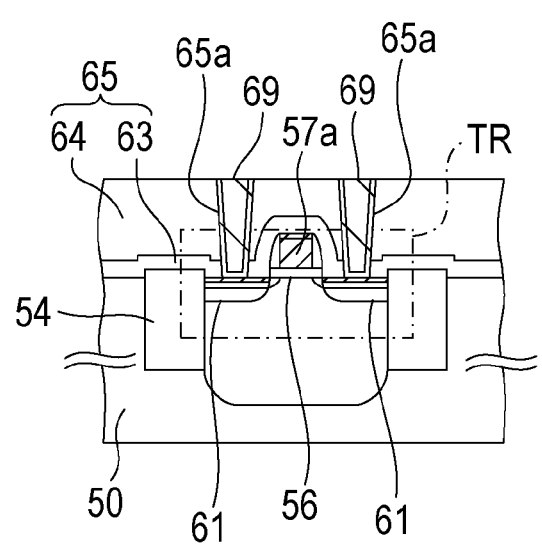

FIGS. 34A through 34N are cross-sectional diagrams illustrating the manufacturing process of a semiconductor device according to the present embodiment.

Manufacturing of a MOS transistor as a semiconductor device will be described.

First, as illustrated in FIG. 34A, a silicon substrate 50 serving as a semiconductor substrate is subjected to thermal oxidization to form a thermally-oxidized film 51 to a thickness of approximately 10 nm, following which a silicon nitride film 52 is formed by low-pressure CVD to a thickness of approximately 140 nm.

Next, as illustrated in FIG. 34B, a first resist pattern 53 having first windows 53a is formed on the silicon nitride film 52. The first resist pattern 53 is then used as a mask to etch the silicon nitride film 52 using RIE (Reactive Ion Etching) with a fluorine gas as the etching gas, thereby forming first holes 52a. Subsequently, the etching gas is changed to a chlorine gas, and the thermally-oxidized film 51 below the holes 52a is etched to form second holes 51a.

With the etching gas as it is, proceeding with the etching etches the silicon substrate 50 below the holes 51a and 52a so as to form grooves 50a for STI (Shallow Trench Isolation), having a depth of around 300 nm. While the width of the grooves 50a is not restricted in particular, with the present embodiment the width is 40 μm.

Subsequently, the first resist pattern 53 is removed.

Next, the procedures up to obtaining the cross-sectional structure illustrated in FIG. 34C will be described. First, a silicon oxide film is formed on the entire face by plasma CVD, thereby completely filling in the grooves 50a. Subsequently, the silicon oxide film is polished by CMP (Chemical Mechanical Polishing) using the silicon nitride film 52 as a polishing stopper, so as to remove the silicon oxide film from above the silicon nitride film 52, and also the silicon oxide film remaining within the grooves 50a forms device dividing insulation films 54. Note that the thickness of the silicon nitride film 52 is reduced to around 50 nm due to the CMP.

While description has been made above with device dividing insulation films 54 for STI being formed, device dividing insulation films may be formed using LOCOS (Local Oxidation of Silicon).

Next, the silicon nitride film 52 is removed by wet etching using phosphoric acid resulting in the cross-sectional structure illustrated in FIG. 34D.

Next, the procedures up to obtaining the cross-sectional structure illustrated in FIG. 34E will be described.

Ion injection of a p-type impurity such as boron is performed to the silicon substrate 50 using the thermally-oxidized film 51 as a flow through film, forming a p-well 55. Subsequently, the thermally-oxidized film 51 damaged by ion injection is removed by wet etching, thereby exposing a cleansed face of the silicon substrate 50. Hydrofluoric acid, for example, is used as the etching fluid for this wet etching.

Next, the silicon substrate 50 is subjected to thermal oxidization again to form a thermally-oxidized film to a thickness of approximately 5 nm, which is used as a gate insulation film 56.

Subsequently, a polysilicon film to serve as a conductive film 57 is formed by CVD, using silane as a reactant gas, upon the device dividing insulation films 54 and gate insulation film 56, to a thickness of around 100 nm.

Next, as illustrated in FIG. 34F, a first resist layer 58 is formed on the conductive film 57.

The silicon substrate 50 is then placed within the electron beam exposure device 1 illustrated in FIG. 1, and the first resist layer 58 is exposed by an electron beam EB, thereby forming a first latent image 58a in the shape of a gate electrode on the first resist layer 58.

At the time of exposure, the exposure data $D_E$ is corrected following the first through fourth embodiments. Accordingly, deformation and change in size of the first latent image 58a due to the proximity effect of the electron beam EB is suppressed, and a first latent image 58a having a width close to that of the design width may be formed on the first resist layer 58.

Next, as illustrated in FIG. 34G, developing the first resist layer 58 leaves the first latent image 58a as a first resist pattern 58b.

The first resist pattern 58b is then masked, and the conductive film 57 is selectively etched by RIE using a chlorine gas as the etching gas, so as to form a gate electrode 57a.

Subsequently, the first resist pattern 58b is removed.

Next, the procedures up to obtaining the cross-sectional structure illustrated in FIG. 34H will be described.

First, with the gate electrode 57a as a mask, ion injection of an n-type impurity such as arsenic is performed to the silicon substrate 50, thereby forming an n-type source/drain extension 59 on the silicon substrate 50 at the side of the gate electrode 57a.

Next, after forming an insulation film of silicon oxide film or the like on the entire upper face of the silicon substrate 50 by CVD, the insulation film is etched back to leave an insulating sidewall 60 on the side faces of the gate electrode 57a.

Subsequently, with the gate electrode 57a and insulating sidewall 60 as a mask, ion injection of an n-type impurity such as phosphorus is performed to the silicon substrate 50. This forms an n-type source/drain region 61 in the silicon substrate 50 at the side of the gate electrode 57a, which is deeper than the n-type source/drain extension 59 and also with a higher impurity concentration.

Next, as illustrated in FIG. 34I, a cobalt film is formed by sputtering on the entire upper face of the silicon substrate 50, following which the cobalt and silicon are caused to react by performing RTA (Rapid Thermal Anneal). Next, the unreacted cobalt film on the device dividing insulation films 54 and so forth is removed by wet etching, leaving a cobalt-silicide layer 62 on the source/drain region 61. The cobalt-silicide layer 62 is also formed on the gate electrode 57a as well, whereby the gate electrode 57a has a polycide structure.

Next, as illustrated in FIG. 34I, a silicon nitride film is formed by CVD on the entire upper face of the silicon substrate 50 so as to serve as an etching stopper layer 63, and further an insulation film 64 is formed of silicon oxide film or the like by CVD thereupon, with these films 63 and 64 serving as an inter-layer insulation film 65. Subsequently, the upper face of the inter-layer insulation film 65 is smoothed by polishing with CMP. As a result of the smoothing, the thickness of the inter-layer insulation film 65 is approximately 700 nm at the flat face of the silicon substrate 50.

Next, as illustrated in FIG. 34K, a second resist layer 68 is formed on the inter-layer insulation film 65.

The second resist layer 68 is then exposed by electron beam EB within the electron beam exposure device 1 (see FIG. 1) based on the exposure data $D_E$ corrected according to the first through fourth embodiments, thereby forming hole-shaped second latent images 68a in the second resist layer 68.

Correcting exposure data D according to the first through fourth embodiments in this way suppresses deformation and change in size of the second latent images 68a due to the proximity effect of the electron beam EB, so the width of the second latent images 68a is closer to the design width.

Subsequently, as illustrated in FIG. 34L, the second resist layer 68 is developed, removing the second latent images 68a, thereby forming a second resist pattern 68c having second windows 68b.

Next, as illustrated in FIG. 34M, the inter-layer insulation film 65 is etched by REI with the second resist pattern 68c are a mask, thereby forming contact holes 65a in the inter-layer insulation film 65 reaching as deep as the cobalt-silicide layer 62.

The etching is performed in the two steps of etching of the insulation film 64 and etching of the etching stopper layer 63, and in the etching of the etching stopper layer 63 the cobalt-silicide layer 62 underneath serves as an etching stopper.

For etching gasses used for etching, a mixed gas of $C_4F_8$, $O_2$, and Ar is used for the insulation film 64, and a mixed gas of $C_4F_8$, $CF_4$, $O_2$, and Ar is used for the etching stopper layer 63.

Subsequently, the second resist pattern 68c is removed.

Next, the procedures up to obtaining the cross-sectional structure illustrated in FIG. 34N will be described.

First, a titanium film and a titanium nitride are formed by sputtering in that order on the walls of the contact holes 65a and the upper face of the inter-layer insulation film 65, so as to serve as a glue film. Next, a tungsten film is formed on the glue film by CVD using tungsten hexafluoride as a reactant gas, with the contact holes 65a being completely filled in by the tungsten film. Subsequently, the excess glue film and tungsten film on the inter-layer insulation film 65 are removed by CMP, leaving the films within the holes 65a as electroconductive plugs 69. The electroconductive plugs 69 are electrically connected to the source/drain region 61.

Thus, the basic structure of a MOS transistor TR having the gate electrode 57a, source/drain region 61, and so on, is completed.

With the present embodiment described above, the exposure method described with the first through fourth embodiments is employed when exposing the first resist layer 58 and second resist layer 68 with the electron beam EB, as described with reference to FIGS. 34F and 34K.

This suppresses deformation and change in size of the latent images 58a and 68a formed in the resist layers 58 and 68 due to the proximity effect at the time of exposure, so the dimensions of device patterns such as the gate electrode 57a, contact holes 65a, and so forth, may be closer to the design width.

As described above, with the exposure method according to the embodiments, in an exposure method using a changed particle beam for example, following correction of the shape of a device pattern, a mask pattern is appropriate such that the center of gravity matches that of the device pattern. In a case of appropriating a mask pattern to a device pattern following correction, the spacing between mask patterns may be broadened in regions where design pattern density is high. Accordingly, in the event that the amount of exposure to mask patterns is increased to deal with underexposure due to difference in density of patterns, the images of adjacent mask patterns move toward each other, so device patterns may be formed at the designed spacing. Accordingly, positional shifting of device patterns and deformation thereof due to the proximity effect may be suppressed.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present inventions have been described in detail, it should be understood that various changes, substitutions, and alterations could be made hereto without departing from the spirit and scope of the invention.

What is claimed is:

1. A charged particle beam exposure method, comprising:
   preparing of exposure data for a plurality of device patterns;
   obtaining of an integral of forward scattering components in an exposure intensity distribution with each of said device patterns near a center of said exposure intensity distribution as domain of integration;
   correcting of a shape of each of said plurality of device patterns by correcting said exposure data, so that said integral is equal to a reference value;
   appropriating of mask patterns within an exposure mask to each of said device patterns following said correction, such that the center of gravity of each of said device patterns matches the center of gravity of the mask pattern appropriated thereto;
   appropriating of exposure amounts to said mask patterns following said appropriation of said mask patterns to each of said device patterns, so that a resist pattern, having a design width in a resist layer exposed by charged particles passing through said mask patterns, is obtained; and
   exposing of said resist layer based on said exposure data following said appropriation of exposure amounts.

2. The charged particle beam exposure method according to claim 1, further comprising:
   dividing of said plurality of mask patterns following said appropriation of exposure amounts into a plurality of groups based on said exposure amount; and
   selecting, from said exposure mask in which said mask patterns are formed in block units, blocks in which said mask patterns have been formed with a similar array as that in said groups;
   wherein, in said exposing of said resist layer, block exposure is performed using said selected blocks.

3. The charged particle beam exposure method according to claim 1, wherein, in said exposing of said resist layer, said exposure mask in which said mask patterns are formed in block units is used, and batch exposure is performed with said exposure amount of said mask pattern of which said exposure amount in said block is the smallest;
   and wherein additional exposure is performed for said mask patterns other than said mask pattern of which said exposure amount is the smallest, so as to compensate for insufficiency in the exposure amount.

4. The charged particle beam exposure method according to claim 3, wherein said additional exposure is performed by irradiating, onto said mask pattern, said charged particle beam which has been shaped to a cross-sectional shape greater than said mask pattern.

5. The charged particle beam exposure method according to claim 1, wherein said exposure mask has a plurality of said mask patterns of which the size and shape are different;
   and wherein said appropriation of said mask patterns to said device patterns is performed by appropriating, of said plurality of mask patterns, said mask patterns with the smallest shape difference as to said device patterns following said correction, to said device patterns.

6. The charged particle beam exposure method according to claim 5, wherein, in the event that there is no mask pattern in said plurality of mask patterns with which said device pattern following said correction is similar, a hypothetical rectangle having the same area as said device pattern following said correction is assumed, and of said plurality of mask patterns, said mask pattern with the smallest shape difference as to said hypothetical rectangle is appropriated to said device pattern.

7. The charged particle beam exposure method according to claim 1, wherein said appropriating of said exposure amount to said mask patterns is performed by
calculating forward scattering intensity defined by an integral of said forward scattering component with said device patterns following said correction as domain of integration, as a function of distance from the center of said mask pattern,
obtaining the value of said forward scattering intensity when said distance is ½ of said design width,
obtaining backscattering intensity of charged particles regarding said device pattern following said correction, and
calculating the ratio between the minimally required accumulated energy of said charged particles to resolve said resist layer, and the sum of said value of forward scattering intensity and said backscattering intensity, as said exposure amount.

8. A semiconductor device manufacturing method, comprising:
preparing of exposure data for a plurality of device patterns;
obtaining of an integral of forward scattering components in an exposure intensity distribution with each of said device patterns near a center of said exposure intensity distribution as domain of integration;
correcting of the shape of each of said plurality of device patterns by correcting said exposure data, so that said integral is equal to a reference value;
appropriating of mask patterns within an exposure mask to each of said device patterns following said correction, such that the center of gravity of each of said device patterns matches the center of gravity of the mask pattern appropriated thereto;
appropriating of exposure amounts to said mask patterns following said appropriation of said mask patterns to each of said device patterns, so that a resist pattern, having a design width in a resist layer exposed by charged particles passing through said mask patterns, is obtained;
exposing of a photoresist layer formed on a semiconductor substrate, based on said exposure data, following said appropriation of exposure amounts;
developing of said photoresist layer to form a resist pattern; and
etching a film underneath said resist pattern with said resist pattern as a mask, so as to form a device pattern.

9. The semiconductor device manufacturing method according to claim 8, further comprising:
dividing of said plurality of mask patterns following said appropriation of exposure amounts into a plurality of groups, by said exposure amount; and
selecting, from said exposure mask in which said mask patterns are formed in block units, blocks in which said mask patterns have been formed with the same array as that in said groups;
wherein, in said exposing of said resist layer, block exposure is performed using said selected blocks.

10. The semiconductor device manufacturing method according to claim 8, wherein, in said exposing of said resist layer, said exposure mask in which said mask patterns are formed in block units is used, and batch exposure is performed with said exposure amount of said mask pattern of which said exposure amount in said block is the smallest;
and wherein additional exposure is performed for said mask patterns other than said mask pattern of which said exposure amount is the smallest, so as to compensate for insufficiency in the exposure amount.

11. The semiconductor device manufacturing method according to claim 8, wherein said device pattern is a hole or a gate electrode.

* * * * *